United States Patent
O'Donnell et al.

(10) Patent No.: US 11,061,086 B2
(45) Date of Patent: Jul. 13, 2021

(54) MAGNETIC DEVICE WITH MAGNETIC STRUCTURE AND MICRO-FLUIDIC STRUCTURE

(71) Applicant: Analog Devices Global, Hamilton (BM)

(72) Inventors: Alan J. O'Donnell, Castletroy (IE); Robert Guyol, Mountain View, CA (US); Maria Jose Martinez, Valencia (ES); Jan Kubik, Limerick (IE); Padraig L. Fitzgerald, Mallow (IE); Javier Calpe Maravilla, Algemesi (ES); Michael P. Lynch, Bruff (IE); Eoin E. English, Pallasgreen (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 16/565,201

(22) Filed: Sep. 9, 2019

(65) Prior Publication Data
US 2020/0003851 A1 Jan. 2, 2020

Related U.S. Application Data

(62) Division of application No. 16/189,854, filed on Nov. 13, 2018, now Pat. No. 10,429,456, which is a (Continued)

(51) Int. Cl.
*G01R 33/09* (2006.01)
*H01F 17/00* (2006.01)
(Continued)

(52) U.S. Cl.
CPC ............... *G01R 33/09* (2013.01); *B81B 3/00* (2013.01); *B81B 3/0091* (2013.01);
(Continued)

(58) Field of Classification Search
CPC .... G01R 33/09; G01R 33/091; G01R 33/095; B81B 3/0091; B81B 3/00; H01F 17/0033;
(Continued)

(56) References Cited

U.S. PATENT DOCUMENTS 4,296,424 A 10/1981 Shibasaki et al.
4,686,469 A 8/1987 Lewis
(Continued)

FOREIGN PATENT DOCUMENTS

CN 102089819 6/2011
CN 103579496 2/2014
(Continued)

OTHER PUBLICATIONS

"Microfluidic Magnetic Particle Sorting and Separation : A Short Review", Last Visited Dec. 16, 2015, Elveflow, (http://www.elveflow.com/microfluidic-tutorials/microfluidic-reviews-and-tutorials/magnetic-particle-separation-a-short-review/), 11 pages.
(Continued)

*Primary Examiner* — Mohamad A Musleh
(74) *Attorney, Agent, or Firm* — Knobbe, Martens, Olson & Bear LLP

(57) ABSTRACT

A magnetic device may include a magnetic structure, a device structure, and an associated circuit. The magnetic structure may include a patterned layer of material having a predetermined magnetic property. The patterned layer may be configured to, e.g., provide a magnetic field, sense a magnetic field, channel or concentrate magnetic flux, shield a component from a magnetic field, or provide magnetically actuated motion, etc. The device structure may be another structure of the device that is physically connected to or arranged relative to the magnetic structure to, e.g., structurally support, enable operation of, or otherwise incorporate the magnetic structure into the magnetic device, etc. The
(Continued)

associated circuit may be electrically connected to the magnetic structure to receive, provide, condition or process of signals of the magnetic device.

20 Claims, 21 Drawing Sheets

Related U.S. Application Data division of application No. 14/973,314, filed on Dec. 17, 2015, now Pat. No. 10,145,906.

(51) Int. Cl.
*H01L 43/08* (2006.01)
*B81B 3/00* (2006.01)

(52) U.S. Cl.
CPC ..... *H01F 17/0006* (2013.01); *H01F 17/0033* (2013.01); *H01L 43/08* (2013.01); *H01F 2017/0066* (2013.01)

(58) Field of Classification Search
CPC ......... H01F 17/0006; H01F 2017/0066; H01L 43/08; H01L 2924/1815; H01L 2224/48091; H01L 2924/181
See application file for complete search history.

(56) References Cited

U.S. PATENT DOCUMENTS

| | | |
|---|---|---|
| 5,475,353 A | 12/1995 | Roshen |
| 5,486,804 A | 1/1996 | Sokolich et al. |
| 5,502,378 A | 3/1996 | Atteberry et al. |
| 6,159,378 A | 12/2000 | Holman et al. |
| 6,335,675 B1 | 1/2002 | Kakinuma et al. |
| 6,392,562 B1 | 5/2002 | Boston et al. |
| 6,410,360 B1 | 6/2002 | Steenberge |
| 6,441,715 B1 | 8/2002 | Johnson |
| 6,623,984 B1 | 9/2003 | Fleischman et al. |
| 6,764,861 B2 | 7/2004 | Prinz et al. |
| 7,037,604 B2 | 5/2006 | Witcraft |
| 7,358,722 B2 | 4/2008 | Peczalski et al. |
| 7,397,326 B2 | 7/2008 | Naito et al. |
| 7,446,524 B2 | 11/2008 | Tondra |
| 7,574,126 B2 | 8/2009 | Honjo et al. |
| 7,598,835 B2 | 10/2009 | Oohashi et al. |
| 7,609,054 B2 | 10/2009 | Tondra et al. |
| 7,892,856 B2 | 2/2011 | Grate et al. |
| 7,906,961 B2 | 3/2011 | Abwa et al. |
| 8,110,119 B2 | 2/2012 | Breuer et al. |
| 8,190,372 B2 | 5/2012 | Kahlman et al. |
| 8,254,769 B2 | 8/2012 | Wu et al. |
| 8,268,446 B2 | 9/2012 | DeSimone et al. |
| 8,305,088 B2 | 11/2012 | Kiss et al. |
| 8,327,527 B2 | 12/2012 | Christenson |
| 8,380,057 B2 | 2/2013 | Wu et al. |
| 8,390,083 B2 | 3/2013 | O'Donnell et al. |
| 8,486,833 B2 | 7/2013 | Bruzewicz et al. |
| 8,488,282 B2 | 7/2013 | Sasaki et al. |
| 8,497,917 B2 | 7/2013 | Ku |
| 8,513,029 B2 | 8/2013 | Zhou |
| 8,564,287 B2 | 10/2013 | Vanhelmont et al. |
| 8,689,981 B2 | 4/2014 | Stone et al. |
| 8,716,959 B2 | 5/2014 | David et al. |
| 8,736,404 B2 | 5/2014 | Knipe |
| 8,742,520 B2 | 6/2014 | Wan et al. |
| 8,815,610 B2 | 8/2014 | Berman et al. |
| 8,823,862 B2 | 9/2014 | Katsumata et al. |
| 8,830,603 B2 | 9/2014 | Lee |
| 8,878,528 B2 | 11/2014 | Quevy |
| 8,947,082 B2 | 2/2015 | Kubik |
| 8,957,680 B2 | 2/2015 | Mori |
| 8,981,773 B2 | 3/2015 | Pozzati et al. |
| 9,054,028 B2 | 6/2015 | Naito et al. |
| 9,103,824 B2 | 8/2015 | Ovsyanko |
| 9,123,877 B2 | 9/2015 | Lei et al. |
| 9,157,891 B2 | 10/2015 | Ovsyanko et al. |
| 9,220,831 B2 | 12/2015 | Ingber et al. |
| 9,255,975 B2 | 2/2016 | Kuo |
| 9,302,902 B2 | 4/2016 | Yaralioglu et al. |
| 9,318,403 B2 | 4/2016 | Kim et al. |
| 9,625,538 B2 | 4/2017 | Chen et al. |
| 9,625,652 B1 | 4/2017 | Yasumura |
| 9,737,244 B2 | 8/2017 | Ziaie et al. |
| 9,766,304 B2 | 9/2017 | Paci |
| 9,773,758 B2 | 9/2017 | Kim |
| 9,796,580 B2 | 10/2017 | Smeys et al. |
| 9,817,087 B2 | 11/2017 | Stenson et al. |
| 9,841,421 B2 | 12/2017 | Dittmer et al. |
| 9,881,660 B2 | 1/2018 | Yoda et al. |
| 9,999,369 B2 | 6/2018 | Ziaie et al. |
| 10,145,906 B2 | 12/2018 | O'Donnell et al. |
| 10,240,186 B2 | 3/2019 | Ionescu-Zanetti et al. |
| 10,253,309 B2 | 4/2019 | Han et al. |
| 10,335,789 B2 | 7/2019 | Issadore et al. |
| 10,350,320 B2 | 7/2019 | Lee et al. |
| 10,429,456 B2 | 10/2019 | O'Donnell et al. |
| 10,627,269 B2 | 4/2020 | Mazumdar et al. |
| 10,809,195 B2 | 10/2020 | Krishnamoorthy et al. |
| 2002/0021860 A1 | 2/2002 | Ruan |
| 2003/0034870 A1 | 2/2003 | Becka |
| 2003/0151479 A1 | 8/2003 | Stafford |
| 2004/0018611 A1 | 1/2004 | Ward et al. |
| 2006/0238925 A1 | 10/2006 | Wang et al. |
| 2007/0170533 A1 | 7/2007 | Doogue et al. |
| 2007/0242152 A1 | 10/2007 | Chen |
| 2007/0285184 A1 | 12/2007 | Eyckmans |
| 2008/0302732 A1 | 12/2008 | Soh et al. |
| 2009/0299570 A1 | 12/2009 | Kammann |
| 2010/0045274 A1 | 2/2010 | Loehndorf |
| 2010/0045285 A1 | 2/2010 | Ohmori et al. |
| 2010/0068854 A1 | 3/2010 | Schirmer |
| 2010/0188782 A1 | 7/2010 | Yamazaki |
| 2011/0091864 A1 | 4/2011 | Karisson |
| 2011/0140814 A1 | 6/2011 | Christenson |
| 2011/0298455 A1 | 12/2011 | Liang et al. |
| 2012/0103768 A1 | 5/2012 | Bachman |
| 2012/0161759 A1 | 6/2012 | Pozzati et al. |
| 2012/0211336 A1 | 8/2012 | Christenson et al. |
| 2012/0222291 A1 | 9/2012 | Liou et al. |
| 2012/0235647 A1 | 9/2012 | Chung et al. |
| 2012/0248553 A1 | 10/2012 | Takano |
| 2012/0306602 A1 | 12/2012 | Christenson |
| 2013/0301182 A1 | 11/2013 | Christenson et al. |
| 2014/0009631 A1 | 1/2014 | Topliss |
| 2014/0048395 A1 | 2/2014 | Christenson |
| 2014/0062646 A1 | 3/2014 | Morrissey et al. |
| 2014/0077906 A1 | 3/2014 | Christenson |
| 2014/0111192 A1 | 4/2014 | Kubik |
| 2014/0152406 A1 | 6/2014 | Christenson |
| 2014/0208580 A1 | 7/2014 | Chung et al. |
| 2014/0232390 A1 | 8/2014 | Fu et al. |
| 2014/0320114 A1 | 10/2014 | Enkovaara |
| 2014/0361348 A1 | 12/2014 | Yoneoka et al. |
| 2014/0370638 A1 | 12/2014 | Lee et al. |
| 2015/0002142 A1 | 1/2015 | Kubik |
| 2015/0035089 A1 | 2/2015 | Liu et al. |
| 2015/0084141 A1 | 3/2015 | Fujimori |
| 2015/0091153 A1 | 4/2015 | Liu et al. |
| 2015/0091636 A1 | 4/2015 | Chung et al. |
| 2015/0108973 A1 | 4/2015 | Sugino |
| 2015/0111332 A1 | 4/2015 | Lee |
| 2015/0162152 A1 | 6/2015 | Christenson et al. |
| 2015/0355295 A1 | 12/2015 | Zimmer et al. |
| 2016/0005530 A1 | 1/2016 | Kubik |
| 2016/0009547 A1 | 1/2016 | Mason et al. |
| 2016/0046483 A1 | 2/2016 | Cheng et al. |
| 2016/0046484 A1 | 2/2016 | Cheng et al. |
| 2016/0052777 A1 | 2/2016 | Lee et al. |
| 2016/0054401 A1 | 2/2016 | Chang et al. |
| 2016/0064126 A1 | 3/2016 | Timonen et al. |
| 2017/0107099 A1 | 4/2017 | Peng et al. |
| 2017/0160351 A1 | 6/2017 | Yamamoto et al. |

(56) References Cited

U.S. PATENT DOCUMENTS

| | | | |
|---|---|---|---|
| 2017/0271574 | A1 | 9/2017 | Inokuchi et al. |
| 2017/0288479 | A1 | 10/2017 | Matyuch et al. |
| 2017/0290562 | A1 | 10/2017 | Corl |
| 2018/0003776 | A1 | 1/2018 | Suess et al. |
| 2018/0122557 | A1 | 5/2018 | Kim et al. |
| 2018/0280977 | A1 | 10/2018 | Baday et al. |
| 2018/0297039 | A1 | 10/2018 | Issadore et al. |
| 2019/0248646 | A1 | 8/2019 | Tsai et al. |

FOREIGN PATENT DOCUMENTS

| | | |
|---|---|---|
| CN | 104793153 | 7/2015 |
| DE | 694 07 194 | 5/1998 |
| EP | 3 141 920 | 3/2017 |
| JP | 08279326 | 10/1996 |
| JP | 2000304765 | 11/2000 |
| JP | 2006/177684 | 7/2006 |
| JP | 2009 524053 | 6/2009 |
| JP | 5078840 | 11/2012 |
| JP | 2013/027215 | 2/2013 |
| JP | 2014-128842 | 7/2014 |
| JP | 2014/128842 | 7/2014 |
| JP | 2015-001467 | 1/2015 |
| JP | 2015-121560 | 7/2015 |
| KR | 101103772 B1 | 1/2012 |
| TW | 201133015 | 10/2010 |
| TW | 1378310 | 12/2012 |
| WO | WO 2015/170509 | 11/2015 |
| WO | WO 2015-170509 | 4/2017 |

OTHER PUBLICATIONS

"Microtechnologies for Biology and Healthcare", LETI, Annual Research Report 2014, 74 pages.
"Op Amp Circuit Collection", National Semiconductor Application Note 31, Sep. 2002, National Semiconductor Corporation, 33 pages.
"Sensor Signal Conditioning IC for Closed-Loop Magnetic Current Sensor", Texas Instruments Incorporated, SBVS104B, Mar. 2009, 35 pages.
"MEMS-Based Magnetic Reed Switch Technology," Coto Technology, 2013, 24 pages. <http://www.mouser.com/pdfdocs/RedRock-White-Paper-130417.pdf>.
Analog Devices, Data Sheet for AD22151: Linear Output Magnetic Field Sensor, Rev. A, Feb. 2003, pp. 1-8.
Analog Devices, Data Sheet for ADA4571: Integrated AMR Angle Sensor and Signal Conditioner, Rev. 0, copyrighted 2014, pp. 1-21.
Hah et al., "Theory and Experiments of Angular Vertical Comb-Drive Actuators for Scanning Micromirrors", IEEE Journal of Selected Topics in Quantum Electronics, vol. 10, No. 3, May/Jun. 2004, pp. 505-513.
Japanese Office Action dated Oct. 30, 2017 for Japanese Patent Application No. 2016-243308, filed Dec. 15, 2016.
Jeong et al., "Two-axis MEMS scanner with transfer-printed high-reflectivity, broadband monolithic silicon photonic crystal mirrors", Jun. 3, 2013, vol. 21, No. 11, Optical Society of America, 10 pages.
Murphy et al., "Lens Drivers Focus on Performance in High-Resolution Camera Modules," Analog Dialogue 4-11, Nov. 2006, 3 pages.
Nickel, "Magnetoresistance Overview", Computer Peripherals Laboratory, HPL-95-60, Jun. 1995, Hewlett-Packard Company, 12 pages.
Office Action dated Nov. 23, 2017 for German Patent Application No. 10 2016 124 651.4, 9 pages and 9 page translation.
Quilici et al., "Embedded Magnetics Technology Overview", Radial Electronics, Feb. 2012, 8 pages.
Syms, "Scaling Laws for MEMS Mirror-Rotation Optical Cross Connect Switches", Journal of Lightwave Technology, vol. 20, No. 7, Jul. 2002, pp. 1084-1094.
Office Action dated Oct. 29, 2018 for Japanese Patent Application No. 2016-243308, filed Dec. 15, 2016.
Office Action dated Jan. 28, 2019 for Chinese Patent Application No. 201611163539.4.
Office Action dated Mar. 7, 2018 for Taiwanese Patent Application No. 105141506, filed Dec. 15, 2016.
Office Action dated Aug. 24, 2020 for Japanese Patent Application No. 2019-199980.
Sun, Xiaolian, et al. "Magnetic Nanoparticles for Magnetoresistance-Based Biodetection," IEEE Transactions on Nanobioscience, vol. 11, No. 1, pp. 46-53, Mar. 2012.
Medgadget Editors, "Magnetic Separation of Sepsis Pathogen Out of Infected Blood," Medgadet, Mar. 25, 2009, available at: https://www.medgadget.com/2009/03/magnetic_separation_of_sepsis_pathogen_out_of_infected_blood.html (accessed: Feb. 22, 2021).
Le, L.T. et al., "Inkjet-Printed Graphene for Flexible Micro-Supercapacitors," 2011 11th IEEE International Conference on Nanotechnology, pp. 67-71, Aug. 15-18, 2011.
Maity, Tuhin, et al., "Manipulation of Magnetic Properties by Tunable Magnetic Dipoles in a Ferromagnetic Thin Film," IEEE Magnetics Letters, vol. 8, 2017.
Notice of Allowance dated Aug. 14, 2018 in Taiwanese Patent Application No. 105141506.
Notice of Allowance dated Mar. 8, 2021 in Taiwanese Patent Application No. 108148662.
Office Action dated Sep. 14, 2020 in Taiwanese Patent Application No. 108148662.
Office Action dated Jan. 13, 2020 in Taiwanese Patent Application No. 10920033490.
Office Action dated Oct. 12, 2019 in Chinese Patent Application No. 201611163539.4.
Rejection Decision dated Jan. 9, 2020 in Chinese Patent Application No. 201611163539.4.
Wang, Fengzhou, et al., "A Mechanically Tunable Artificial Magnetic Conductor using 3-D Printing Technology," Proceedings of the 48th European Microwave Conference, Sep. 25-27, 2018.
Yasui, Masato, et al., "Magnetic Micro Actuator with Neutral Buoyancy and 3D Fabrication of Cell Size Magnetized Structure," 2012 IEEE International Conference on Robotics and Automation, pp. 745-750, May 14-18, 2012.
Office Action dated Apr. 5, 2021 for Japanese Patent Application No. 2019-199980.

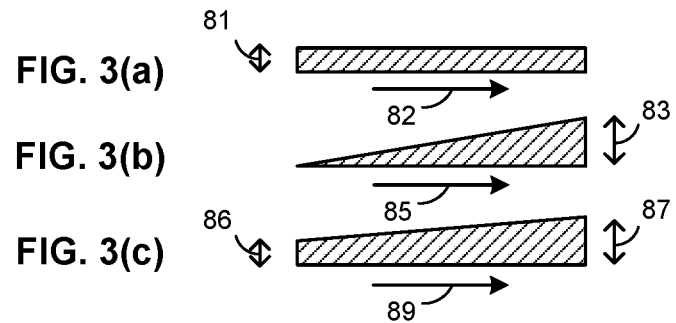
FIG. 3(a)
FIG. 3(b)
FIG. 3(c)
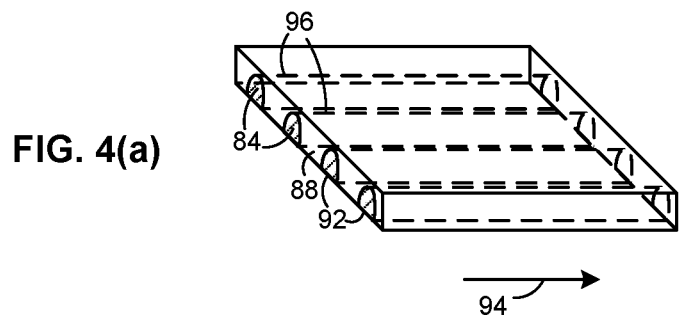
FIG. 4(a)
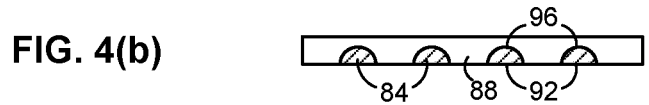
FIG. 4(b)
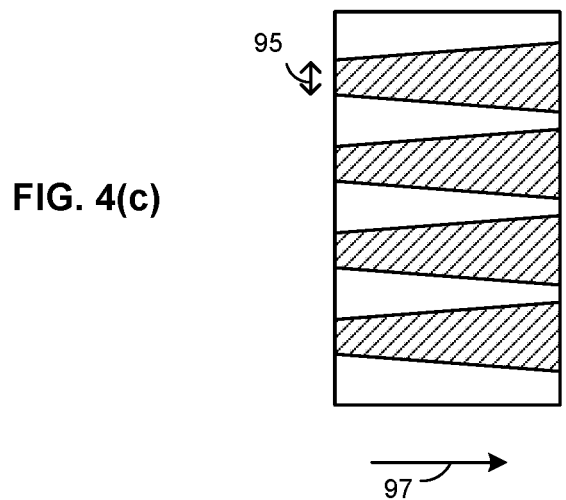
FIG. 4(c)
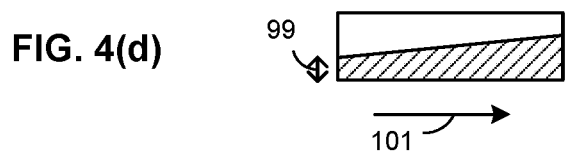
FIG. 4(d)

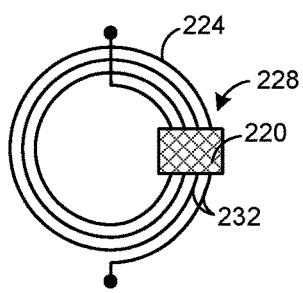
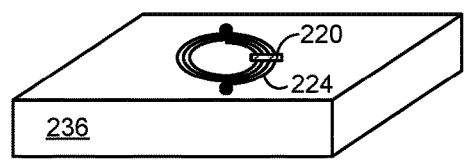
FIG. 12    FIG. 13
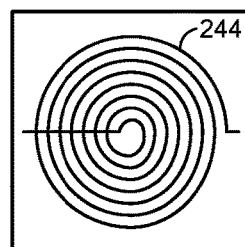
FIG. 14(a)
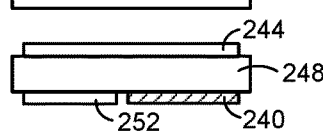
FIG. 14(b)
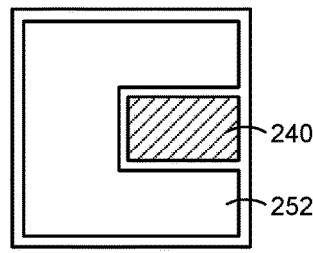
FIG. 14(c)
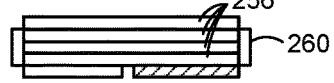
FIG. 14(d)
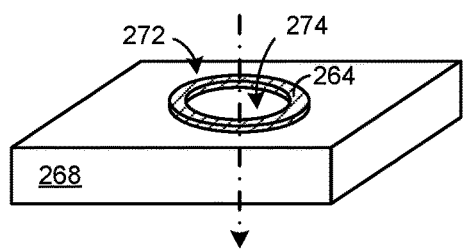
FIG. 15

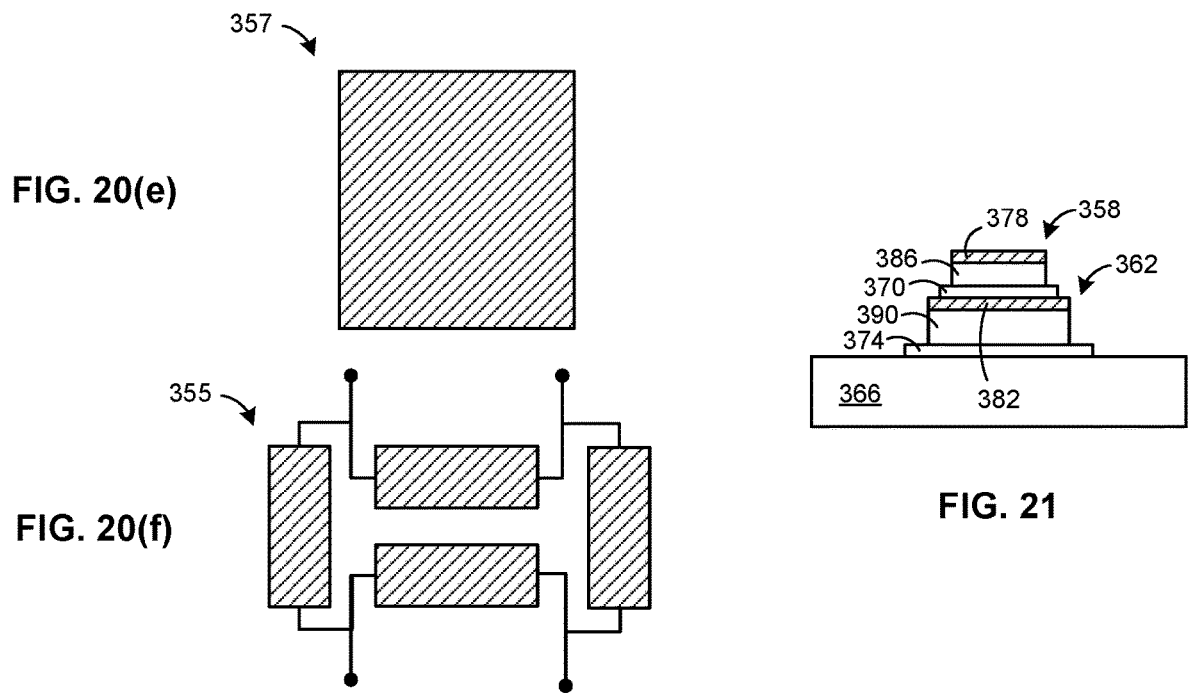
FIG. 20(e)
FIG. 20(f)
FIG. 21
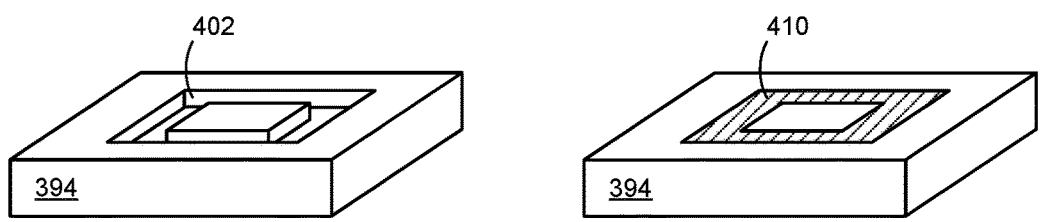
FIG. 22(a)
FIG. 22(c)
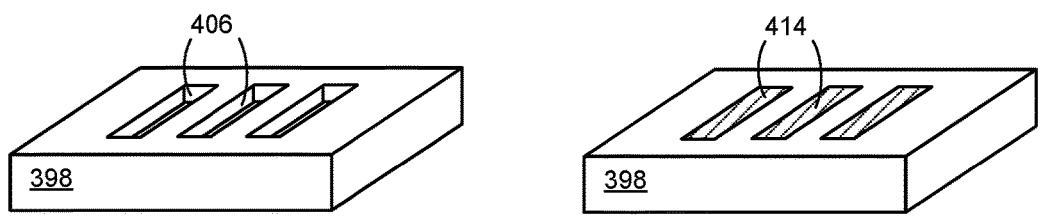
FIG. 22(b)
FIG. 22(d)

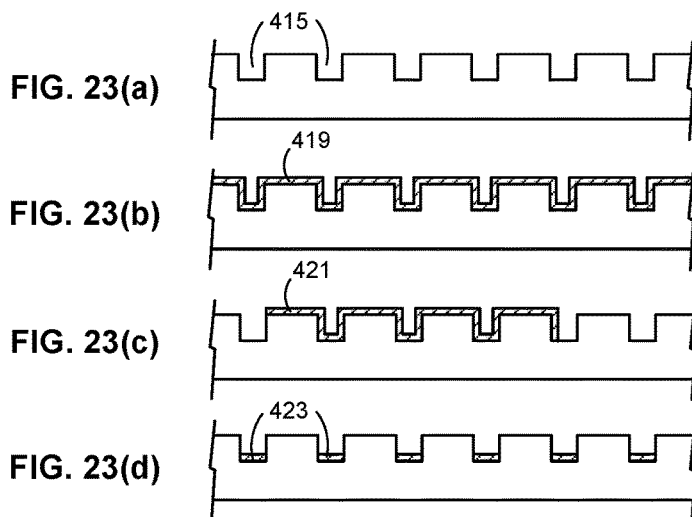
FIG. 23(a)
FIG. 23(b)
FIG. 23(c)
FIG. 23(d)
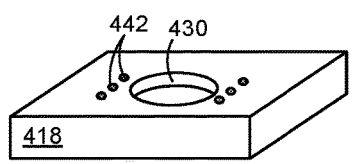
FIG. 24(a)
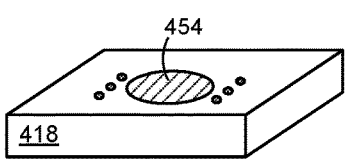
FIG. 24(d)
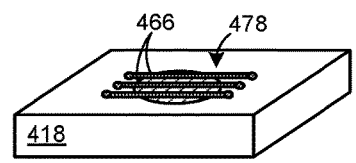
FIG. 24(g)
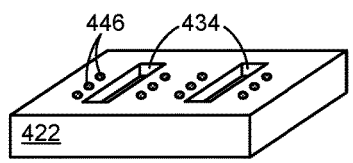
FIG. 24(b)
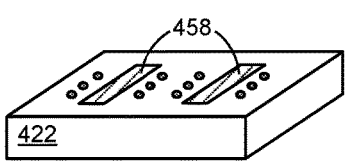
FIG. 24(e)
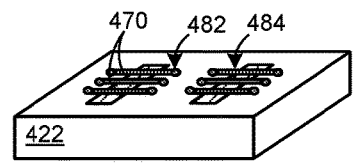
FIG. 24(h)
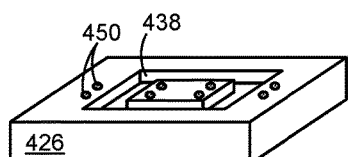
FIG. 24(c)
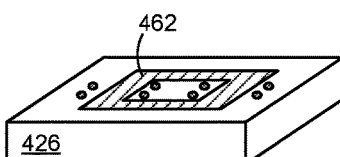
FIG. 24(f)
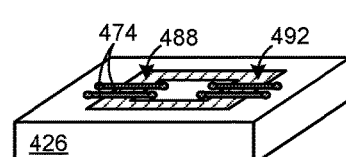
FIG. 24(i)

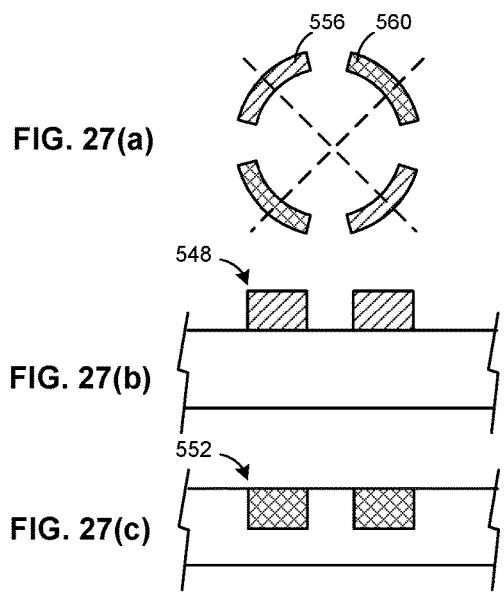
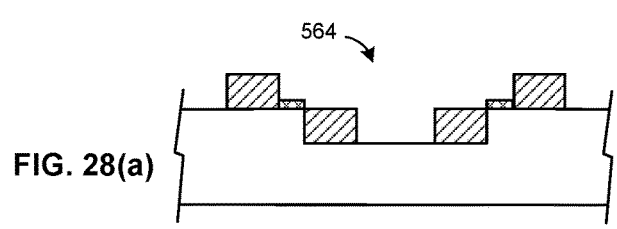
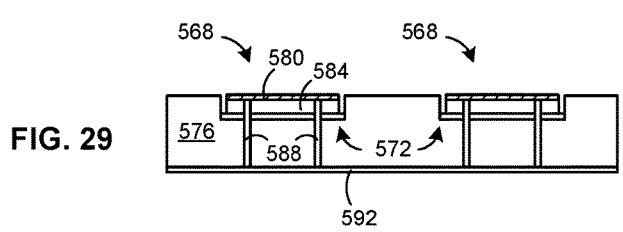
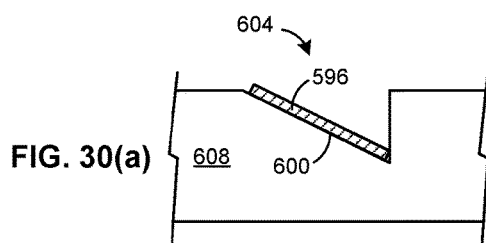
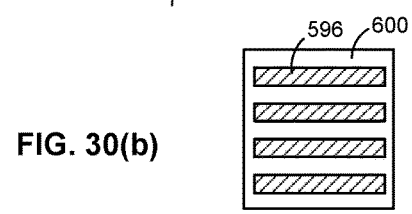
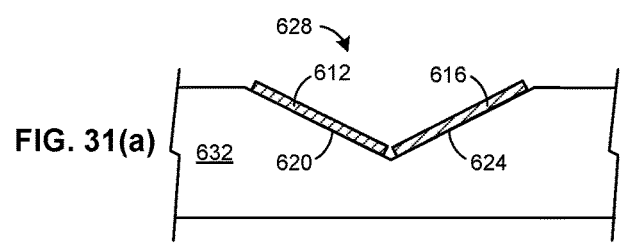
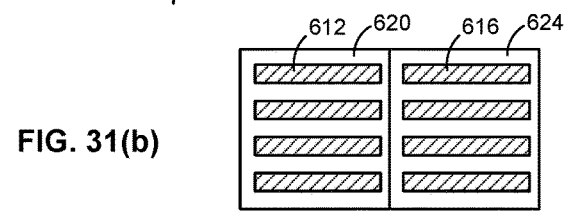
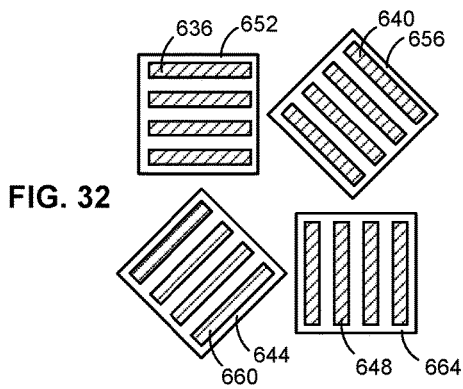

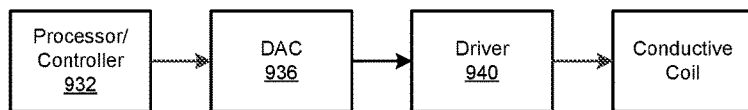
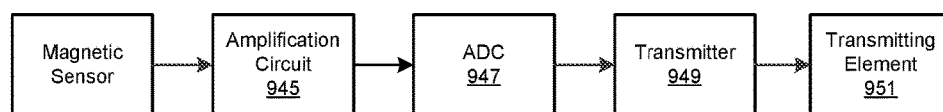
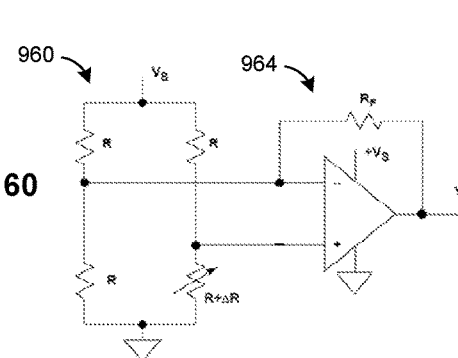
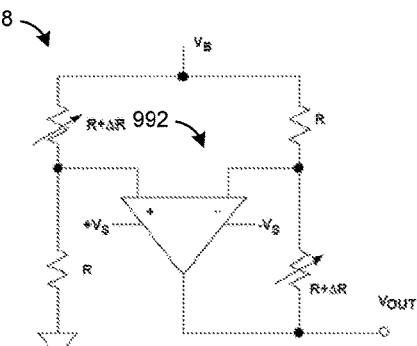
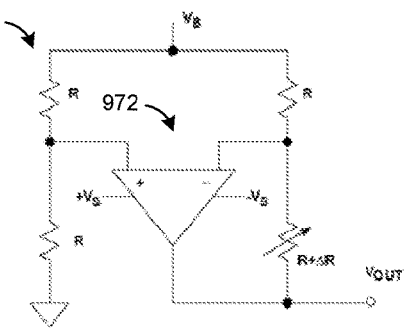
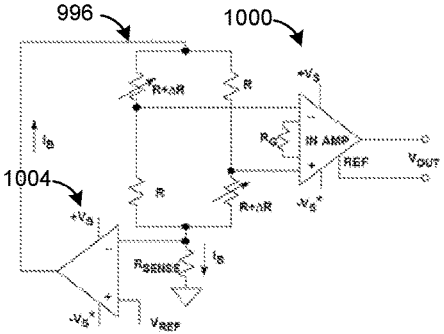
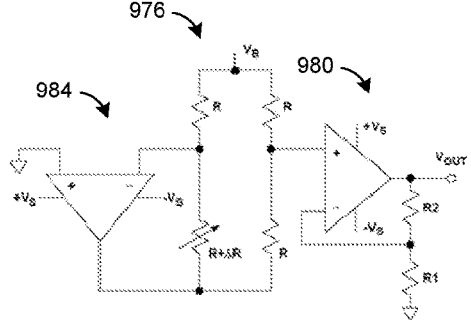
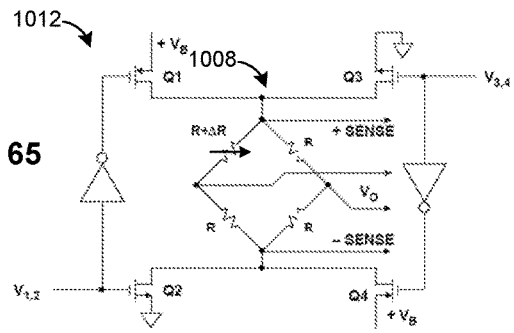

MAGNETIC DEVICE WITH MAGNETIC STRUCTURE AND MICRO-FLUIDIC STRUCTURE

CROSS REFERENCE TO RELATED APPLICATIONS

This application is a divisional of U.S. patent application Ser. No. 16/189,854, filed Nov. 13, 2018 and titled "MODULES AND METHODS INCLUDING MAGNETIC STRUCTURES," which is a divisional of U.S. patent application Ser. No. 14/973,314, filed Dec. 17, 2015 and titled "DEVICES, SYSTEMS AND METHODS INCLUDING MAGNETIC STRUCTURES," the disclosures of each of which are herein incorporated by reference in their entireties.

BACKGROUND INFORMATION

Many applications utilize magnetic structures to perform sensing, actuation, and communication, etc. in devices such as integrated circuits, sensors, and micromechanical devices, etc. Such devices may include magnetic structures in place of or in addition to other elements, such as electronic structures.

However, problems arise when integrating magnetic structures into various devices. Manufacturing materials having specific magnetic properties, such as producing a magnetic field or having electrical properties that vary as a function of a magnetic field, typically involves specific requirements, such as related to temperature or contaminants during the manufacturing process. These requirements often conflict with, or unduly restrain, the manufacturing of other materials, such as semiconductors, dielectric and metals, in the same device.

Devices including magnetic structures also typically require specific operational conditions, such as related to the path of a magnetic field, which sometimes conflict with or unduly constrain operational conditions, such as related to other electric, magnetic or electro-magnetic fields, of other elements included in the same device.

Therefore, a need exists for magnetic devices, systems and corresponding methods that integrate magnetic structures in an improved manner.

BRIEF DESCRIPTION OF THE DRAWINGS

So that features of the present invention may be understood, a number of drawings are described below. However, the appended drawings illustrate only particular embodiments of the invention and are therefore not to be considered limiting of its scope, for the invention may encompass other equally effective embodiments.

FIGS. 3(*a*)-3(*c*) are cross-sectional side views depicting embodiments of a patterned layer of material.

FIGS. 4(*a*)-4(*d*) are perspective and cross-sectional side views depicting embodiments of a composite layer including a patterned layer of material.

FIG. 12 is a top view depicting embodiments of a magnetic structure and a conductive coil.

FIG. 13 is a perspective view depicting an embodiment of a magnetic device including a magnetic structure and a conductive coil on a substrate.

FIGS. 14(*a*)-14(*d*) depict top, side and bottom views of an embodiment of the magnetic device including a magnetic structure and a conductive coil on a substrate.

FIG. 15 depicts a perspective view of an embodiment of a magnetic structure on a substrate.

FIG. 21 is a side view depicting an embodiment of the magnetic device including a plurality of stacked magnetic structures.

FIGS. 22(*a*)-22(*d*) are perspective views depicting embodiments of the magnetic device at stages of fabrication to form a magnetic structure in one or more recesses on a substrate.

FIGS. 23(*a*)-23(*d*) are cross-sectional side views depicting embodiments of the magnetic device at stages of fabrication to form a magnetic structure coating a plurality of recesses on a substrate.

FIGS. 24(*a*)-24(*i*) are perspective views depicting embodiments of the magnetic device at stages of fabrication to form a magnetic structure and conductive wiring in and about one or more recesses on a substrate.

FIGS. 27(*a*)-27(*c*) are cross-sectional top and side views depicting an embodiment of a magnetic structure on different levels of a substrate.

FIGS. 28(*a*)-28(*b*) are cross-sectional side views depicting embodiments of a magnetic device including a magnetic flux concentrator and a magnetic sensor in and about a recess on a substrate.

FIG. 29 is a cross-sectional side view depicting embodiments of a magnetic structure in a recess on a back side of a substrate.

FIGS. 30(*a*)-30(*b*) are cross-sectional side and top views depicting an embodiment of a magnetic structure formed on an angled wall of a recess on a substrate.

FIGS. 31(*a*)-31(*b*) are cross-sectional side and top views depicting an embodiment of a magnetic structure formed on a plurality of angled walls of a recess on a substrate.

FIG. 32 is a top view depicting embodiments of magnetic structures formed on angled walls of a plurality of recesses on a substrate.

FIG. 58 is a circuit schematic depicting an embodiment of a circuit to generate and provide electrical signals to a conductive coil.

FIG. 59 is a circuit schematic depicting an embodiment of a magnetic structure and a circuit to transmit a signal based on electrical signals from the magnetic structure.

FIG. 60 is a circuit schematic depicting an embodiment of a magnetic sensor and an amplification circuit to provide an output representing a magnetic field sensed by the magnetic sensor.

FIG. 61 is a circuit schematic depicting an embodiment of a magnetic sensor and an amplification circuit to provide an output representing a magnetic field sensed by the magnetic sensor.

FIG. 62 is a circuit schematic depicting an embodiment of a magnetic sensor and an amplification circuit to provide an output representing a magnetic field sensed by the magnetic sensor.

FIG. 63 is a circuit schematic depicting an embodiment of a magnetic sensor and an amplification circuit to provide an output representing a magnetic field sensed by the magnetic sensor.

FIG. 64 is a circuit schematic depicting an embodiment of a magnetic sensor and an amplification circuit to provide an output representing a magnetic field sensed by the magnetic sensor.

FIG. 65 is a circuit schematic depicting an embodiment of a magnetic sensor and a driver circuit that may be used to drive the magnetic sensor.

DETAILED DESCRIPTION OF EXAMPLE EMBODIMENTS

Embodiments of a magnetic device may incorporate a magnetic structure in an improved manner to provide one or more of improved device area utilization, manufacturability, reliability, performance or cost. The magnetic device may include the magnetic structure, another device structure, and an associated circuit.

The magnetic structure may interact magnetically with the environment of the magnetic device. The magnetic structure may include a layer of material that has a selected magnetic property such as producing a magnetic field or being responsive to a magnetic field. The layer may be patterned to provide one or more separate layer portions having selected shapes, and may be combined with other layers, to provide the selected magnetic properties. The magnetic structure may provide functionalities such as magnetic sensing, magnetic flux channeling, magnetic flux concentrating, magnetic shielding, magnetically actuated motion, etc.

The device structure may be another structure of the device that is physically connected to or arranged relative to the magnetic structure in a predetermined manner to, for example, structurally support, enable the operation of, or more advantageously integrate into the magnetic device the magnetic structure. The device structure may include, for example, a substrate, a layer on the substrate, a recess or aperture in the substrate, or a cap on the substrate, etc. The device structure also may optionally interact with the magnetic structure and/or environment of the magnetic device. For example, the device structure may include a conductive coil to generate a magnetic field. The device structure also may include package and module elements.

The associated circuit may be electrically connected to one or both of the magnetic structure and other device structure to provide functions such as, for example, receiving, providing, conditioning or processing of signals of the magnetic device. The circuit may include one or more of an amplification circuit, an analog-to-digital converter, a digital-to-analog converter, a driver circuit, a processor, a controller, etc. The circuit may be integrated with the magnetic structure on the same substrate or provided on another substrate. The circuit also may be provided as separate components in a device such as a packaged device or module.

Figure 1:
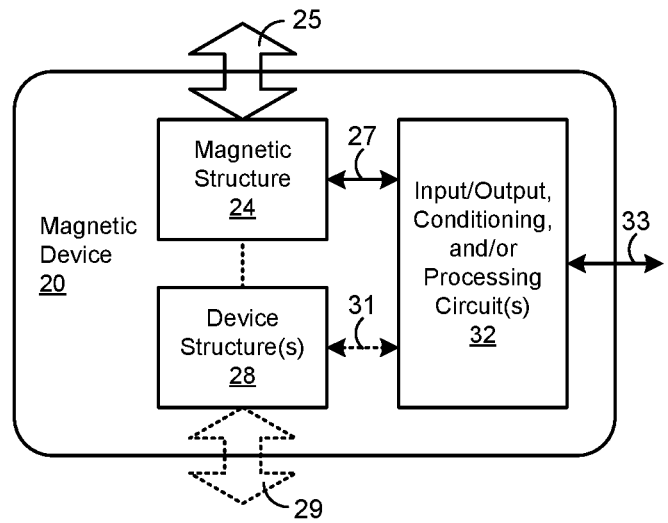
FIG. 1 is a schematic diagram depicting an embodiment of a magnetic device.

FIG. 1 depicts an embodiment of a magnetic device 20 that incorporates a magnetic structure 24 in an improved manner to provide one or more of improved device area utilization, manufacturability, reliability, performance or cost. The magnetic device 20 may include the magnetic structure 24, another device structure 28, and an associated circuit 32. The magnetic structure 24 may interact magnetically 25 with the environment of the magnetic device 20. The device structure 28 may be another structure of the device 20 that is physically connected to or arranged relative to the magnetic structure 24 in a predetermined manner. The device structure 28 also may optionally interact 29 with the environment of the magnetic device 20. The associated circuit 32 may be electrically connected 27, 31 to one or both of the magnetic structure 24 and other device structure 28 to provide one or more functions such as providing, receiving, conditioning or processing of signals. The circuit 32 also may be electrically connected 33 external to the magnetic device to receiving or provide data to or from the magnetic device.

The magnetic structure may include a layer of material with a selected magnetic property, such as producing a magnetic field or producing a response to a magnetic field.

For example, the material may produce a temporary or permanent magnetic field.

Materials that produce a temporary magnetic field may be referred to as soft magnetic materials, and materials that produce a permanent magnetic field may be referred to as hard magnetic materials. Soft magnetic materials may include, e.g., ferromagnetic material, ferrimagnetic material, etc. Ferromagnetic materials may include, e.g., iron, nickel, cobalt, gadolinium, etc. Ferrimagnetic materials may include, e.g., ferrites of manganese, copper, nickel, iron, etc. Hard magnetic materials may include Alnico, SmCo, NdFeB, etc.

The material may have a selected permeability to magnetic fields, such as a permeability above a predetermined threshold. Magnetic materials that have a selected permeability to magnetic fields, such as a permeability above a predetermined threshold, may include soft magnetic materials, etc.

The material may produce a response to a magnetic field by having an electrical property that varies as a function of the magnetic field experienced by the material. Such a material may include a magnetoresistive material having an electrical resistance that varies as a function of the magnetic field. Magnetoresistive materials may include, e.g., anisotropic magnetoresistive material, colossal magnetoresistive material, etc. Anisotropic magnetoresistive materials may include, e.g., nickel iron, etc. Colossal magnetoresistive materials may include, e.g., manganese perovskite oxides, etc. One or more layers of magnetoresistive material also may be arranged with one or more layers of other material to form a composite magnetoresistive structure. Such a composite magnetoresistive structure may include, e.g., a giant magnetoresistance structure, a tunnel magnetoresistance structure, etc.

The magnetic structure of any of the embodiments of the magnetic device discussed herein may include a material having any of the magnetic properties discussed herein, such as any of producing a magnetic field or producing a response to a magnetic field as discussed herein, among other properties. In some embodiments, the magnetic device may provide selected functionality by specifically utilizing materials having certain selected magnetic properties.

The layer of material may be patterned to impart a perimeter, boundary or shape to the layer to provide specific magnetic properties of the magnetic structure. The specific magnetic properties may include the ability to produce or respond to magnetic fields along specific spatial directions or orientations.

Figure 2A:
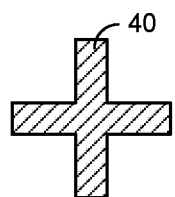
FIGS. 2(*a*)-2(*k*) are top views depicting embodiments of a patterned layer of material having a selected magnetic property.
Figure 2B:
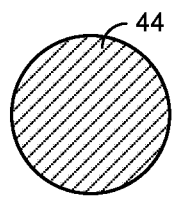
Figure 2C:
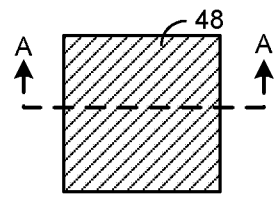
Figure 2D:
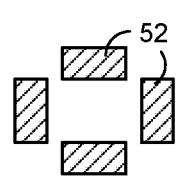
Figure 2E:
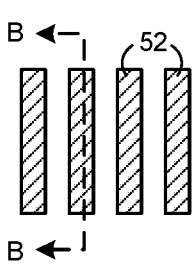
Figure 2F:
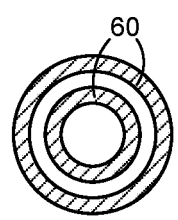
Figure 2G:
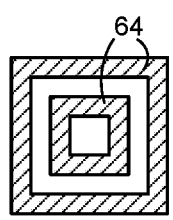
Figure 2H:
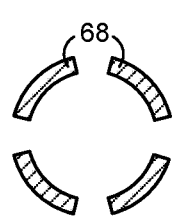
Figure 2I:
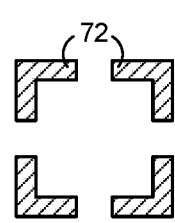
Figure 2J:
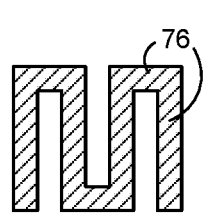
Figure 2K:
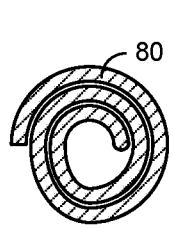

FIGS. 2(a)-2(k) depict top views of layers patterned to provide selected perimeters, boundaries or shapes. FIGS. 2(a)-2(c) depict embodiments of patterned layers having a cross-shaped, circular, and square or rectangular shapes 40, 44, 48, respectively. FIGS. 2(d)-2(e) depict embodiments of patterned layers having a plurality of separate rectangular, square or linear portions 52, 56 arranged in a pattern or array, such as with subsets of the portions arranged facing each, as in FIG. 2(d), or in an array with a characteristic spacing between them, as in FIG. 2(e). FIGS. 2(f)-2(g) depict embodiments of patterned layers having a plurality of separate portions forming concentric rings 60, as in FIG. 2(f), or strips 64 outlining rectangular or square shapes with aligned centers, as in FIG. 2(g). FIGS. 2(g)-2(h) depict embodiment of patterned layers having a plurality of separate arcuate segments 68 arranged to outline a ring, as in FIG. 2(g), or a plurality of L- or T-shaped segments 72 arranged to outline a square or rectangle, as in FIG. 2(h). FIG. 2(j) depicts an embodiment of a patterned layer having a plurality of linear portions 76 connected together to form a single integral segment following a back and forth path. FIG. 2(k) depicts an embodiment of a patterned layer having a spiral shape 80.

Additional embodiments of the patterned layer may include other arrangements of one or more layer portions. The patterned layer of material may include arrangements of a plurality of any of the exemplary shapes depicted in FIGS. 2(a)-2(k) or other shapes. For example, the patterned layer may include a plurality of shapes arranged in one or two dimensional arrays with characteristic periodic spacing between instances of the shapes in the one or two dimensions. Additional embodiments may include only a single ring or strip of the shapes in FIGS. 2(f)-2(g); one or more arcuate, T-shaped or L-shaped sections shown in FIGS. 2(h)-2(i) in different arrangements; or a plurality of linear or other segments similar to those in FIGS. 2(e) and 2(j) connected to follow a different path.

The patterned layer of material also may have a selected height characteristic perpendicular to a plane in which the perimeter, boundary or shape of the layer is defined. The selected height characteristic may provide specific magnetic properties of the magnetic structure, such as the ability to produce or respond to magnetic fields along specific spatial directions or orientations.

FIGS. 3(a)-3(c) depict cross-sectional side views of embodiments of patterned layers having selected height characteristics perpendicular to a plane in which the perimeter, boundary or shape of the layer is defined. The depicted cross-sections may represent a slice of the patterned layer taken along an axis parallel to the plane in which the perimeter, boundary or shape of the layer is defined, such as along the axes A-A or B-B depicted in FIGS. 2(c) and 2(e), or along other axes in other directions in the planes of the shapes of FIGS. 2(a)-2(k). FIG. 3(a) depicts an embodiment of the patterned layer having a substantially constant height 81 in the direction perpendicular to the plane defining the shape of the layer along an axis 82 parallel to the plane defining the shape. A substantially constant height may provide substantially constant magnetic properties of the patterned layer along the axis.

FIGS. 3(b)-3(c) depict embodiments of the patterned layer having a height in the direction perpendicular to the plane defining the shape of the layer that vary along axes parallel to the plane defining the shape. In FIG. 3(b), the patterned layer may have a height varying from substantially zero to a predetermined height 83, and in FIG. 3(c), the patterned layer may have a height varying from a first predetermined height 86 to a second predetermined height 87 different than the first predetermined height. The height of the patterned layer also may vary according to a selected function of the distance along the axes 85, 89. In FIGS. 3(b)-3(c), the height may vary as a linear function of the distance along the axes 85, 89. In other embodiments, the height may vary according to other functions of the distance along the axis 85, 89, such as non-linear functions, stepped functions, etc. A varying height may provide correspondingly varying magnetic properties of the patterned layer along the axis. For example, embodiments of a varying height may be used to produce or respond to magnetic fields along the axis to provide position detection or current sensing of an object along the axis.

The patterned layer of material may be formed in an integral manner with one or more other layers to form a composite layer. FIGS. 4(a)-4(b) depict perspective and cross-sectional side views, respectively, of an embodiment of a patterned layer of material formed in an integral manner with another layer of material. The patterned layer of material may include a plurality of separate portions 84 embedded in the other material 88 so that the other material 88 occupies spaces between the separate portions 84 of the magnetic layer. The patterned layer of material may optionally include a first set of surfaces 92 exposed at a first surface or boundary of the composite layer, and a second set of surfaces 96 covered by the other material 88 within the composite layer. The other layer of material 88 may be a material having a selected magnetic property or another type of material.

The composite layer may provide specific magnetic, electric or structural properties. In embodiments in which the second material 88 is also a material having a selected magnetic property, the second material 88 may alter, such as increase, decrease, or otherwise set, the magnetic properties of the patterned layer of material 84 to provide specific magnetic properties of the composite layer. In embodiments in which the second material 88 is another type of material, the second material 88 also may alter the magnetic properties of the patterned layer of material 84 to provide specific magnetic properties of the composite layer, or may alternatively provide structural or electrical properties to the composite layer.

The embedded portions of the patterned layer also may have a selected cross-sectional area. In FIGS. 4(a)-4(b), the embedded portions may have a rounded or semi-circular cross-sectional area. In other embodiments, the embedded portions may have other cross-sectional areas, such as one or more of square, rectangular, or trapezoidal cross-sectional areas, etc.

The cross-sectional area of the embedded portion also may have a selected constancy along axes. In FIGS. 4(a)-4(b), the embedded portions may have a substantially constant cross-sectional area along a longitudinal axis 94 to which the portions are aligned. FIG. 4(c) depicts a cross-sectional top view of another embodiment of a composite layer in which the embedded portions may have a cross-sectional area having a width 95 that changes along a longitudinal axis 97 in a predetermined manner, such as in a linear manner. FIG. 4(d) depicts a cross-sectional side view of another embodiment of a composite layer in which the embedded portions may have a cross-sectional area having a height 99 that changes along a longitudinal axis 101 in a predetermined manner, such as in a linear manner.

Figure 5A:
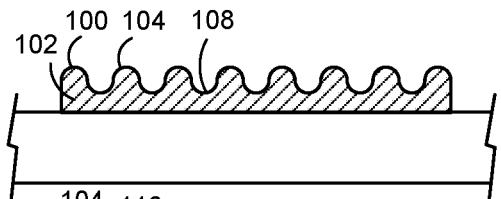
FIGS. 5(*a*)-5(*d*) are cross-sectional side views depicting embodiments of a patterned layer of material having a selected magnetic property.
Figure 5B:
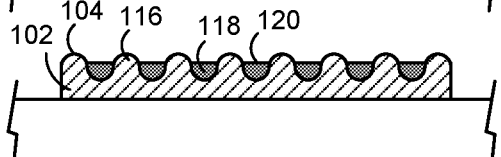
Figure 5C:
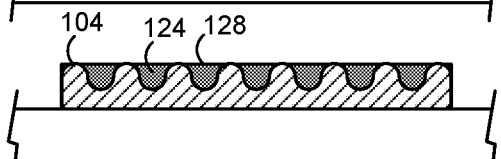
Figure 5D:
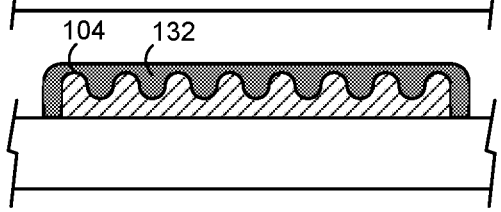

The layer of material having the selected magnetic property may include a surface with a selected topography. The selected topography may provide specific magnetic, electric or structural properties to the layer. FIG. 5(a) depicts a cross-sectional view of a layer of material 102 having a top surface 100 with a plurality of projections 104 and recesses 108. The plurality of projections 104 may be formed in an array having a characteristic periodic spacing between them, as may be the plurality of recesses 108. The projections 104 and recesses 108 may be interleaved with each other. The layer of material with the selected topography also may be formed in an integral manner with one or more additional layers to form a composite layer, as discussed above. FIGS. 5(b)-5(d) depict cross-sectional views of a patterned layer of material having a selected topography formed in an integral manner with another layer of material. In FIG. 5(b), the projections 104 of the patterned layer 102 may include portions 116 exposed above a top surface 120 of the second layer of material 118. In FIG. 5(c), the projections 104 of the patterned layer 102 and the top surface 128 of the second layer of material 124 may be located at substantially the same level. In FIG. 5(d), the second layer of material 132 may completely enclose the projections 104 of the patterned layer.

Figure 6A:
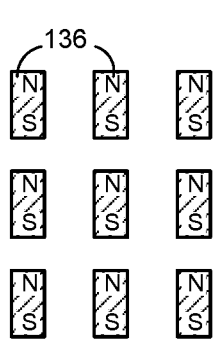
FIGS. 6(*a*)-6(*d*) are top views depicting embodiments of a patterned layer of material.
Figure 6B:
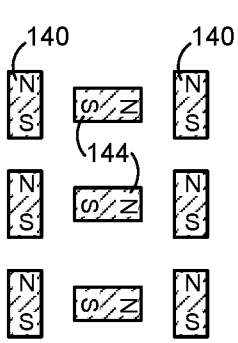
Figure 6C:
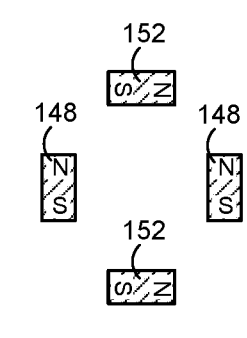
Figure 6D:
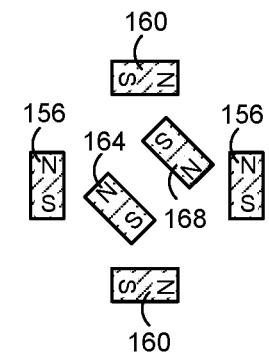

The layer of material having the selected magnetic property may include a plurality of separate portions having magnetic polarities aligned according to a selected configuration to provide specific magnetic properties. FIGS. 6(a)-6(d) depict top views of embodiments of patterned layers including a plurality of separate portions with aligned magnetic polarities. FIG. 6(a) depicts an embodiment of a patterned layer including a plurality of separate portions 136 arranged in a two dimensional array, each of the separate portions 136 having magnetic pole axis aligned in a same direction. FIGS. 6(*b*)-6(*c*) depict embodiments of a patterned layer including a first plurality of separate portions 140, 148 arranged in an array, each having magnetic pole axis aligned in a same first direction, and a second plurality of separate portions 144, 152 also arranged in an array, each having magnetic pole axis aligned in a same second direction, the first and second directions being perpendicular to each other. FIG. 6(*d*) depicts an embodiment of a patterned layer including first and second pluralities of separate portions 156, 160 having magnetic pole axes respectively aligned in first and second perpendicular directions, and third and fourth separate portions 164, 168 having magnetic pole axes respectively aligned in third and fourth perpendicular directions.

The magnetic structure of any of the embodiments of the magnetic device discussed herein may include a patterned layer having any of the properties of patterned layers discussed herein, such as any of the properties of patterned layers discussed in regard to any of FIGS. 2-6 and their various subfigures (i.e., (a), (b), etc.), among other properties.

The magnetic structure may be incorporated into the magnetic device in part through its physical connection or arrangement relative to another structure of the magnetic device in a predetermined manner to one or more of structurally support, enable the operation of, or otherwise integrate into the magnetic device the magnetic structure.

Figure 7:
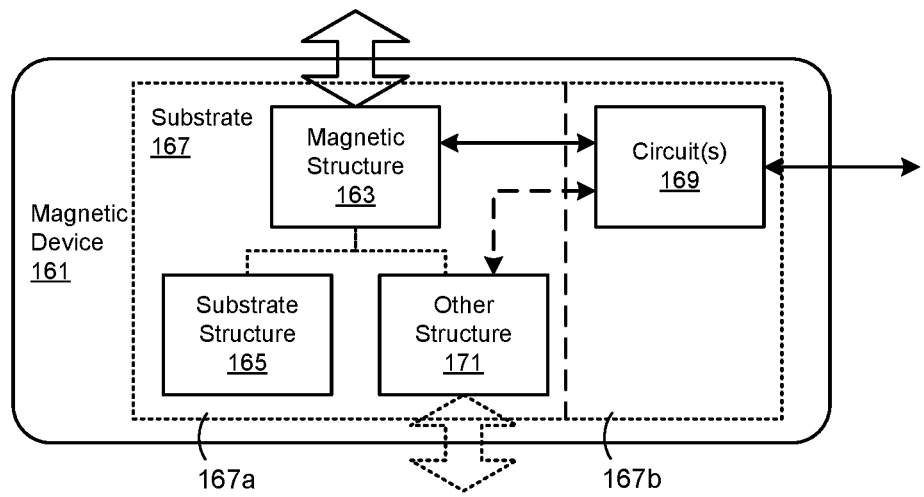
FIG. 7 is a schematic diagram depicting an embodiment of the magnetic device as a substrate-based magnetic device.
Figure 8A:
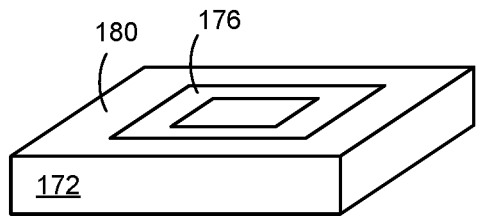
FIGS. 8(*a*)-8(*d*) are perspective views depicting embodiments of the magnetic device at stages of fabrication to form a magnetic structure on a substrate.
Figure 8C:
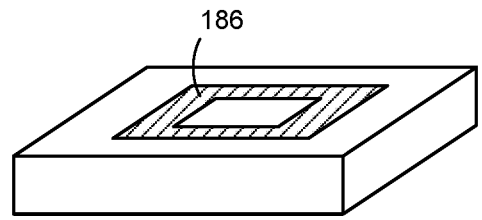
Figure 8B:
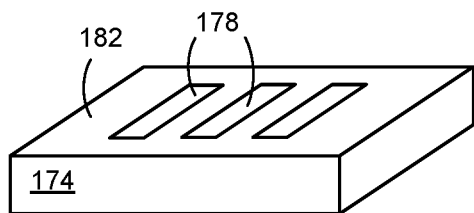
Figure 8D:
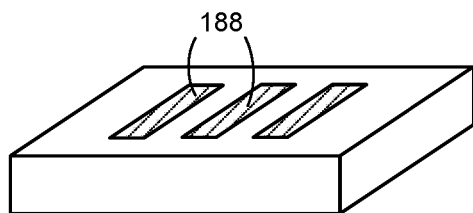

The magnetic structure may be connected to or arranged relative to a structure of a substrate. FIG. 7 depicts an embodiment of the magnetic device 161 as a substrate-based magnetic device having a magnetic structure connected or arranged relative to a structure of a substrate. The magnetic device 161 may include one or more substrates 167, a magnetic structure 163, and an associated circuit 169.

The substrate may include one or more substrate structures 165, such as one or more of a surface, a recess, a side, etc. The magnetic structure may be physically connected or arranged relative to the one or more substrate structures in a predetermined manner.

The magnetic device also may optionally include one or more other structures 171, such as a coil, cap, micromechanical structure, antenna, etc. The magnetic structure may be physically connected to or arranged relative to the other structure in a predetermined manner.

The circuit may be electrically connected to one or both of the magnetic structure and the other device structure to provide, receive, condition or process etc. signals of the magnetic structure or other device structure. The circuit also may provide or receive electrical signals external to the magnetic device, such as one or more of receiving data for controlling a component of the magnetic device, such as to provide a magnetic field to set or change a magnetic field in the magnetic structure, or to transmit data from a component of the magnetic device, such as to transmit data based on an electrical signal produced by the magnetic structure.

The substrate may include a semiconductor. For example, the substrate may be a semiconductor substrate such as utilized to manufacture integrated circuits. In some such embodiments, the magnetic device may be part of an integrated circuit. The substrate alternatively or in addition may include other types of materials, such as one or more of an insulator, glass, ceramic, etc. For example, the substrate may include an insulator such as utilized to manufacture silicon-on-insulator circuits, a glass such as utilized to manufacture displays and other devices, or a ceramic such as utilized to manufacture hybrid circuits.

The magnetic device may include a single substrate on or about which the magnetic structure and the circuit are formed. For example, in one embodiment, the magnetic device may be a single integrated circuit including both the magnetic structure and the associated circuit. Alternatively, the magnetic device may include more than one substrate. For example, the magnetic device may include a first substrate 167*a* on or about which the magnetic structure is formed and a second substrate 167*b* on or about which the circuit is formed.

Any of the embodiments of the magnetic device discussed herein may include one or more substrates according to any of the embodiments of the substrate discussed herein.

The magnetic structure may include a patterned layer of material having a selected magnetic property formed on a substrate in a predetermined manner in relation to other circuits that may be formed on the substrate. In embodiments, the patterned layer may be formed on one or more areas of the substrate without active circuits. FIGS. 8(*a*)-8(*b*) depict embodiments of a magnetic device at a first stage of a method of fabricating the magnetic device, after a substrate 172, 174 is provided that includes one or more areas 176, 178 without active circuits and one or more areas 180, 182 with or for which active circuits are planned. Active circuits may include powered integrated circuit devices such as transistors. The one or more areas 176, 178 without active circuits may have the same shape as or encompass shapes of the patterned layer of material. The substrate 172, 174 may be processed to produce the one or more areas 176, 178 without active circuits, such as by removing layers on top of the substrate or otherwise conditioning the area to more effectively receive the patterned layer of material. FIGS. 8(*c*)-8(*d*) depict embodiments of the magnetic device at a second stage of the method of fabrication, in which the patterned layer of material 186, 188 has been formed on the substrates in FIGS. 8(*a*)-8(*b*) in the one or more areas without active circuits. The layer 186, 188 may assume various shapes as discussed above. The layer 186, 188 may be formed in the areas without active circuits at a separate time as the active circuits, in a separate processing apparatus, or both, to prevent or reduce cross-contamination of the magnetic material with materials of the active circuits.

In other embodiments, the patterned layer may be formed in a same area on the substrate as active circuits. For example, the patterned layer may be formed as a layer above or below a one or more layers containing active circuits formed on the substrate.

Figure 9A:
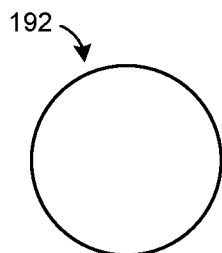
FIGS. 9(*a*)-9(*c*) are bottom views depicting embodiments of a semiconductor wafer at stages of fabrication to form a magnetic structure on the wafer.
Figure 9B:
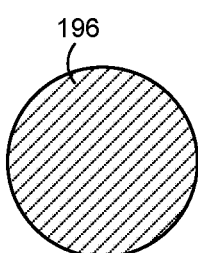
Figure 9C:
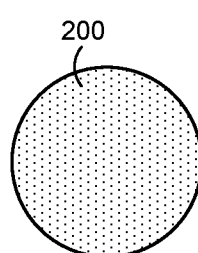

The patterned layer also may be formed on a back side of a substrate. The back side of the substrate may exclude include active circuits. The patterned layer may be formed on the back side of a substrate wafer simultaneously for a plurality of integrated circuits or other substrate devices. FIG. 9(*a*) depicts an embodiment of a bottom view of a semiconductor wafer 192 from which a plurality of integrated circuits or other substrate devices may ultimately be separated after processing. FIG. 9(*b*) depicts an embodiment of a bottom view of the wafer of FIG. 9(*a*) at a stage of fabrication after a layer of material 196 having a selected magnetic property has been formed across substantially the entire back surface of the wafer. FIG. 9(*c*) depicts an embodiment of a bottom view of the wafer of FIGS. 9(*a*)-9(*b*) at a further stage of fabrication, after the layer has been patterned to form patterned layer shapes 200 on the back side of the wafer for each of a plurality of integrated circuits or other substrate devices into which the wafer may be separated.

Figure 10A:
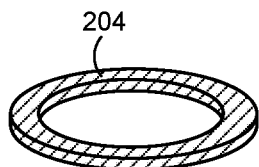
FIGS. 10(*a*)-10(*b*) are perspective views depicting embodiments of a magnetic structure.
Figure 10B:
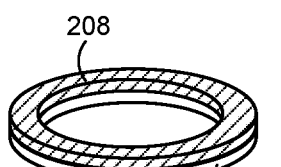

The magnetic structure may be formed as a separate structure that may be attached to a substrate. FIG. 10(a) depicts an embodiment of a patterned layer 204 formed as a separate structure. The separate structure may be formed by one or more of punching, casting, plating, rolling, or depositing, etc. the magnetic layer into the separate structure. The layer also may be formed on a corresponding substrate as a separate structure. FIG. 10(b) depicts an embodiment of a patterned layer 208 formed on a corresponding substrate 212 as a separate structure. The substrate 212 may have the same or a corresponding boundary or shape as the layer 208. The substrate 212 also may provide structural support for the layer 208, as well as facilitate fabrication of the layer 208.

Figure 11:
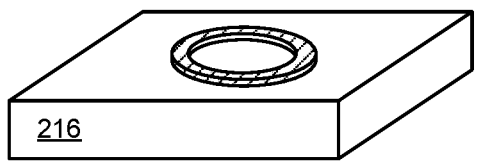
FIG. 11 is a perspective view depicting an embodiment of a magnetic structure on a substrate.

The magnetic device may include the separate magnetic structure attached to a substrate. FIG. 11 depicts an embodiment of the magnetic device that may include the separate magnetic structure attached to a substrate 216.

The magnetic structure also may be physically connected to or arranged relative to other device structures. In embodiments, the other device structure may be a conductive coil. The magnetic structure may be located relative to the conductive coil in a predetermined manner to provide one or more of magnetic, electrical or structural interaction between the magnetic structure and conductive coil. For example, the conductive coil may be operated to provide a magnetic field to set or change a magnetic field in the magnetic structure. The conductive coil also may operate as a transmitter to communicate data based on an electrical signal produced by the magnetic structure, such as to transmit data representing a magnetic field or current sensed by the magnetic structure.

FIG. 12 depicts a top view of embodiments of the magnetic structure 220 and conductive coil 224. The magnetic structure 220 may be located in a predetermined manner with respect to a portion 228 of the conductive coil 224. For example, the magnetic structure 220 may be located above or below a section 228 of the conductive coil 224. The section 228 of the conductive coil 224 may include a plurality of conductive segments 232 232 with current flowing in substantially a same direction. The conductive coil 224 may include a layer of conductive material, such as metal, formed into a pattern, such as spiral or other coiling pattern, to produce sections having a plurality of conductive segments with current flowing in substantially a same direction.

The magnetic device may include the magnetic structure and conductive coil incorporated onto a same side of a substrate such as semiconductor or other substrate. FIG. 13 depicts an embodiment of the magnetic device that may include the magnetic structure 220 and conductive coil 224 formed on a first side of a substrate 236.

The magnetic structure and conductive coil also may be incorporated onto different areas or sides of a substrate. FIGS. 14(a)-14(c) depict another embodiment of the magnetic device incorporating the magnetic structure 240 and conductive coil 244 onto opposite sides of a substrate 248. FIG. 14(a) depicts a top view of the magnetic device, showing the conductive coil 244 formed as a layer on a first side of a substrate 248. FIG. 14(c) depicts a bottom view of the magnetic device, showing the magnetic structure 240 formed as a patterned layer on a second side of the substrate 248. FIG. 14(b) depicts a side cross-sectional view of the magnetic device, showing the conductive coil 244 as the layer on the first side of a substrate 248 and the magnetic layer 240 on the second side of the substrate 248. The substrate 248 may optionally also include areas including active circuitry 252, such as on either the first or second side of the substrate. In FIG. 14(c), an area including active circuitry 252 may be included on the second side of the substrate 248 in a separate area from that including the magnetic layer 240.

The conductive coil may optionally be formed as plurality of layers. FIG. 14(d) depicts a side cross-sectional view of another embodiment of the magnetic device similar to that of FIGS. 14(a)-14(c), but showing the conductive coil 256 formed as a plurality of layers extending from the first side of a substrate 260 to the second side of the substrate 260.

Embodiments in which the magnetic structure is located above or below a section of the conductive coil, such as those of, e.g., FIGS. 12, 13 and 14(a)-14(d), may be useful for operation to provide a magnetic field to set or change a magnetic field in the magnetic structure. Embodiments in which the magnetic structure may be located in a different area or different side of the substrate from the conductive coil, such as those of, e.g., FIGS. 14(a)-14(d), and 34 (discussed below), may be useful for operation of the conductive coil as a transmitter to communicate data based on an electrical signal produced by the magnetic structure. Alternatively, the magnetic device may include a structure and/or circuit other than a conductive coil to operate as a transmitter to communicate data based on an electrical signal produced by the magnetic structure, such as one or more of an antenna, a transmitter circuit, etc.

The magnetic device may incorporate the magnetic structure in the predetermined manner so that it is physically aligned with an aperture in a device structure such as a substrate structure or other device structure. FIG. 15 depicts an embodiment of a magnetic device having a patterned layer 264 formed on a substrate 268. Each of the patterned layer 264 and substrate 268 may include an aperture 272, 274 extending from a top surface of the layer 264 or substrate 268 to a bottom surface of the layer 264 or substrate 268. Furthermore, the patterned layer 264 may be positioned relative to the substrate 268 so that the aperture 272 in the patterned layer 264 aligns with the aperture 274 in the substrate 268. The alignment of the apertures 272, 274 may create a path of travel for another component or device through the apertures 272, 274 from one side of the magnetic device to the other.

Figure 16A:
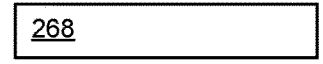
FIGS. 16(*a*)-16(*c*) are cross-sectional side views depicting embodiments of the magnetic device at stages of fabrication to form a magnetic structure on a substrate.
Figure 16B:
Figure 16C:
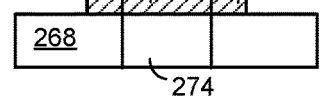

The alignment of the apertures in the magnetic structure and another device structure may be achieved as a result of a fabrication process for the magnetic device. FIGS. 16(a)-16(c) depict embodiments of the magnetic device at various stages of a method of fabricating the magnetic device. FIG. 16(a) depicts a cross-sectional side view of an embodiment of the magnetic device at a first stage of the method, after the substrate 268 is provided. FIG. 16(b) depicts a cross-sectional side view of the magnetic device at a second stage of the method, after the patterned layer 264 is formed on the substrate 268. The patterned layer 264 may be formed in different ways, such as by one or more of depositing, plating, or growing, etc. the patterned layer. FIG. 16(c) depicts a cross-sectional side view of an embodiment of the magnetic device at a third stage of the method, after the aperture 272, 274 is formed through the patterned layer 264 and the substrate 268. The aperture 272, 274 may be formed in both the patterned layer 264 and substrate 268 by the same process, such as by one or more of etching, drilling, or otherwise removing material to form the aperture. Forming the aperture 272, 274 through both the patterned layer 264 and the substrate 268 using the same process may provide both an efficient method of forming the aperture 272, 274 and an accurate alignment of the apertures 272, 274 in the patterned layer 264 and the substrate 268.

The magnetic device also may include one or more magnetic structures arranged relative to each other to provide selected magnetic and other functionalities. In embodiments, the magnetic device may include one or more magnetic structures arranged to provide a magnetic flux concentrator to selectively channel or concentrate magnetic flux. Such a magnetic structure may include one or more patterned layers having a plurality of separate portions with different distributions of material having selected magnetic properties to selectively channel or concentrate magnetic flux. For example, the magnetic structure may include one or more patterned layers to channel or concentrate magnetic flux from a first flux concentration at a first flux surface to a second flux concentration different than the first flux concentration at a second flux surface, the second flux surface having a different distribution or area than the first flux surface.

Figure 17A:
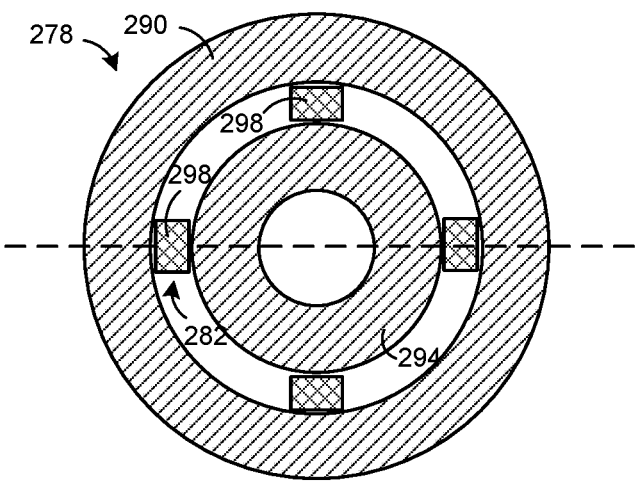
FIGS. 17(*a*)-17(*b*) are top and cross-sectional side views depicting an embodiment of the magnetic device including a magnetic flux concentrator and a magnetic sensor on a substrate.
Figure 17B:
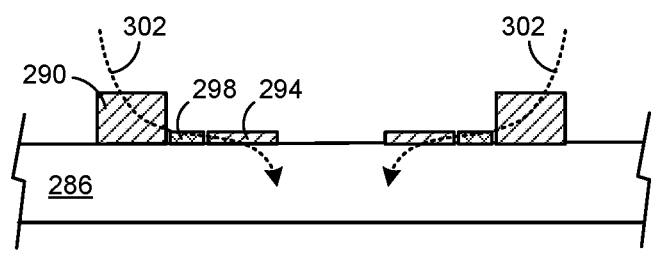

FIG. 17(a) depicts a top view of an embodiment of a magnetic device configured to provide a magnetic flux concentrator, and FIG. 17(b) depicts a cross-sectional side view of the embodiment of the magnetic device taken along the axis in FIG. 17(a). The magnetic device may include a magnetic flux concentrator 278, a magnetic sensor 282, and a substrate 286. The magnetic flux concentrator 278 may include a plurality of patterned layers having one or more of different distributions of material having selected magnetic properties along a selected dimension, or different flux surface areas. A first patterned layer 290 may include an outer concentric ring and a second patterned layer 294 may include an inner concentric ring. The outer concentric ring may be formed on the substrate 286 to a first height, and the inner concentric ring may be formed on the substrate 286 to a second height less than the first height. As a result, the outer concentric ring may have a different material distribution in the vertical direction and different flux surface areas than the inner concentric ring. The material of the patterned layers of the magnetic flux concentrator may be a material having a relatively high permeability to magnetic fields, such as permeability above a predetermined threshold.

The magnetic sensor 282 also may include a magnetic structure including a patterned layer of material 298. The patterned layer of material 298 of the magnetic sensor 282 may be formed on the substrate 286 at locations between the first and second patterned layers 290, 294. The magnetic sensor 282 also may include electrical interconnections and other components as discussed below. The material of the magnetic sensor may be a magnetoresistive material.

In operation, the magnetic flux concentrator 278 of FIGS. 17(a)-17(b) may channel and/or concentrate the magnetic flux of a magnetic field in the environment of the magnetic device in a predetermined manner so that the magnetic flux passes through the magnetic sensor 282 in a selected direction and at a selected concentration. FIG. 17(b) shows an exemplary path of magnetic flux 302 in the space about and through the magnetic device. Above and below the magnetic device, the magnetic flux may be oriented in substantially the vertical direction. As the magnetic flux passes through the magnetic flux concentrator 278, it may deviate along the depicted path as a result of the relative arrangement of the patterned layers 290, 294, which may provide a preferential path for magnetic flux as a function of their magnetic properties. This may result in the magnetic flux bending to take a substantially or at least more horizontal path as it passes through the magnetic sensor 282. Channeling and/or concentrating of the magnetic flux along a selected direction may provide a number of advantages, including one or more of enabling the magnetic sensor 282 to be configured to have an operational sensitivity to magnetic fields along the horizontal direction instead of the vertical direction, which may be advantageous for fabrication of the sensor 282, and enabling configurations of a magnetic device that may sense both vertical and horizontal magnetic fields using similar sensor arrangements.

Embodiments of the magnetic device to provide a magnetic flux concentrator may include magnetic structures having patterned layers including other shapes. A magnetic device similar to that of FIGS. 17(a)-17(b) may include a magnetic flux concentrator and a magnetic sensor each having a respective patterned layer including any of the shapes depicted in FIGS. 2(a)-2(k). For example, the magnetic flux concentrator may include a partnered layer having first and second aligned rectangles such as depicted in FIG. 2(g), segmented concentric rings or aligned squares similar to as depicted in FIGS. 2(h) and 2(i), etc.

Embodiments of the magnetic device to provide a magnetic flux concentrator also may include magnetic structures having patterned layers including varying heights. A magnetic device similar to that of FIGS. 17(a)-17(b) may include one or more of a magnetic flux concentrator or a magnetic sensor having a height in the vertical direction in FIGS. 17(a)-17(b) that varies along the horizontal direction in FIGS. 17(a)-17(b), such as depicted in FIGS. 3(b)-3(c). For example, the magnetic flux concentrator may include a patterned layer having an outer portion having a height that varies between a first height at a first location, such as at the outermost location of the outer portion, and a second height less than the first height at a second location, such as at the innermost location of the outer portion. Similarly, the magnetic sensor also may include a patterned layer having a height that varies between a first height at a first location and a second height different than the first height at a second location.

Figure 18A:
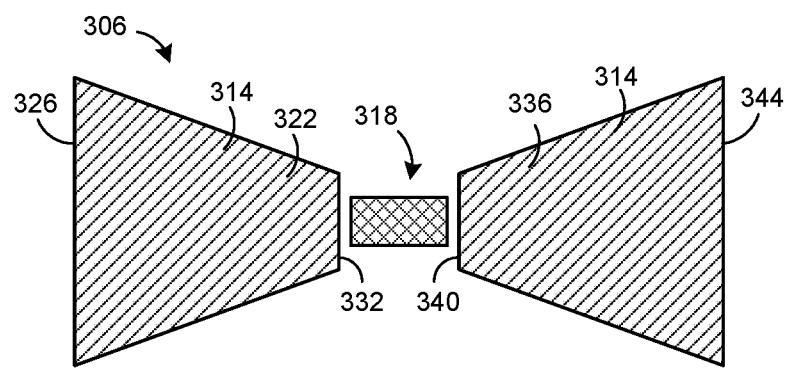
FIGS. 18(*a*)-18(*b*) are top and cross-sectional side views depicting an embodiment of the magnetic device including a magnetic flux concentrator and a magnetic sensor on a substrate.
Figure 18B:
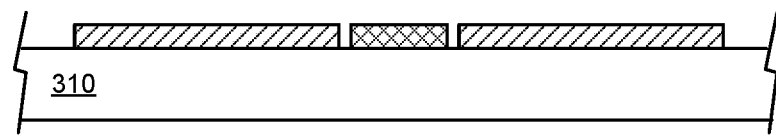

The magnetic device may provide still other embodiments of a magnetic flux concentrator to selectively channel or concentrate magnetic flux along different paths. FIGS. 18(a)-18(b) depict top and side cross-sectional views of an embodiment of a magnetic device including magnetic structures providing another magnetic flux concentrator 306. The magnetic device may include a first magnetic structure and a second magnetic structure formed on a substrate 310 or a layer on a substrate. The first magnetic structure may include a first patterned layer of material 314 including one or more separate segments providing a magnetic flux concentrator 306 to concentrate or channel magnetic flux for the second magnetic structure. The second magnetic structure may provide a magnetic sensor 318. The material of the magnetic flux concentrator may be a material having a relatively high permeability to magnetic fields, such as a permeability above a predetermined threshold, and material of the magnetic sensor may be a magnetoresistive material.

The first patterned layer 314 may provide magnetic flux channeling or concentration by providing a decreasing surface area for the magnetic flux travel. For example, the first patterned layer may include a segment 322 providing a channeling or concentrating of magnetic flux from a first flux concentration at a flux entry area 326 to a second flux concentration larger than the first flux concentration at a flux exit area 332 smaller than the flux entry area. The first patterned layer also may include a segment 336 providing a channeling or concentrating of magnetic flux from a third flux concentration at a flux entry area 340 to a fourth flux concentration smaller than the third flux concentration at a flux exit area 344 larger than the flux entry area.

In other embodiments, the magnetic device may provide yet further configurations of magnetic flux concentrators. For example, the magnetic device may include a magnetic structure similar to those discussed above in regard to FIGS. 17(a)-17(b) or 18(a)-18(b), but arranged to channel or concentrate magnetic flux as it travels in various different selected directions, such as in one or more of between different concentrations in a single direction, such as a vertical direction, a horizontal direction, or another direction; or as it changes direction from first direction to a second direction, such as a change in direction from a horizontal to vertical direction, from a vertical to a horizontal direction, or from any first predetermined direction to any second different predetermined direction.

In the above and other embodiments, the magnetic device may include a magnetic structure arranged to operate as a magnetic sensor. The magnetic sensor may include a plurality of resistors electrically interconnected between one or more predetermined voltages and one or more output terminals, such as in a bridge formation. At least one of the resistors may be a magnetoresistor formed from a patterned layer of magnetoresistive material. The magnetoresistor may be a variable resistor having an electrical resistance that varies as a function of a magnetic field to which the sensor is exposed. The electrical configuration of the sensor may utilize the variable resistor to provide an output voltage at the output terminals as a function of the magnetic field.

Figure 19:
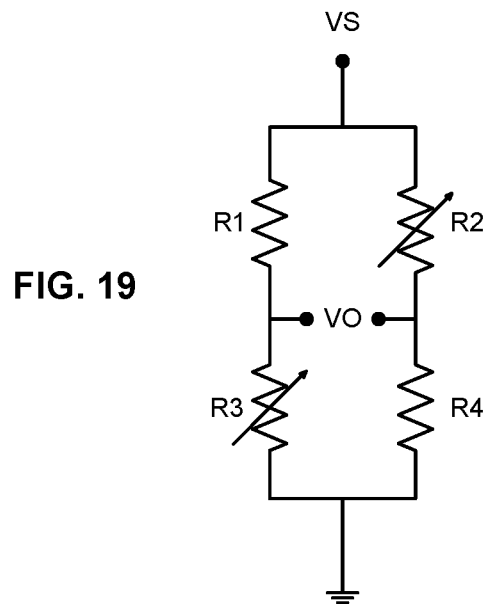
FIG. 19 is a circuit schematic depicting an embodiment of a magnetic sensor.

FIG. 19 is a schematic diagram depicting an electrical representation of an embodiment of a magnetic sensor. The magnetic sensor may include two pairs of resistors R1, R2, R3, R4 arranged in a bridge configuration between a supply voltage VS and ground, with first and second output terminals taken at the middle of two legs of the bridge. One or more of the resistors, such as one resistor R2 from an upper half of one of the legs of the bridge, and another resistor R3 from a lower half of the other of the legs, may be magnetoresistors. In operation, the bridge may become unbalanced and provide a corresponding output voltage VO between the output terminals as a result of the variation in resistance value of the variable resistors R2, R3 as a function of the magnetic field experienced by the sensor.

Embodiments of a magnetic structure arranged to operate as a magnetic sensor may include one or more standard resistors formed from an electrically resistive material, such as polysilicon layer or a diffusion region formed in a substrate, and one or more magnetoresistors formed from a patterned layer of magnetoresistive material.

Alternatively, embodiments of a magnetic structure arranged to operate as a magnetic sensor may include one or more standard resistors formed from a patterned layer of magnetoresistive material and a patterned layer of magnetic shielding material, and one or more magnetoresistors formed from the patterned layer of magnetoresistive material.

Figure 20A:
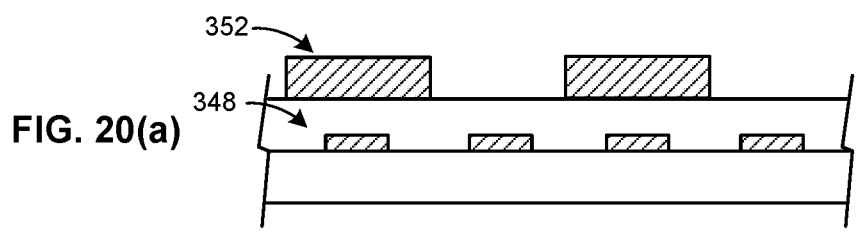
FIGS. 20(*a*)-20(*f*) are cross-sectional side and top views depicting an embodiment of the magnetic device including a magnetic sensor having a magnetic shield on a substrate.

FIGS. 20(a)-20(f) depict embodiments of magnetic structures configured to provide a magnetic sensor such as depicted in FIG. 19. FIG. 20(a) depicts a cross-sectional side view of a magnetic structure that may be used to implement a magnetic sensor. The magnetic structure may include a first patterned layer of material 348 formed on a first surface of a layer formed on a substrate, and a second patterned layer of material 352 formed on a second surface of second layer formed on a substrate. The first and second surfaces may be displayed vertically from each other.

Figure 20B:
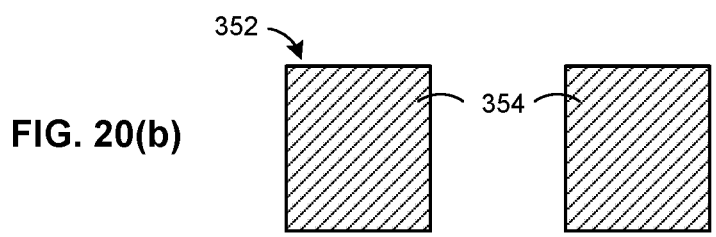
Figure 20C:
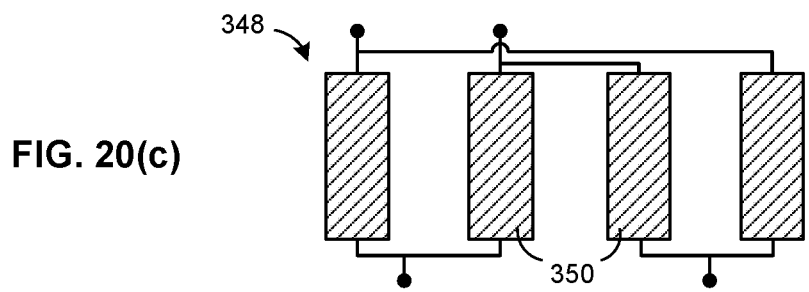

The first patterned layer 348 may be used to implement resistors of the magnetic sensor. FIG. 20(c) depicts a cross-sectional top view of an embodiment of the magnetic sensor of FIG. 20(a), showing greater detail of an embodiment of the first patterned layer 348. The first patterned layer 348 may include a plurality of separate segments 350, each of the separate segments 350 implementing a different resistor of the magnetic sensor. The first patterned magnetic layer 348 may include a first material such as a magnetoresistive material.

The second patterned layer 352 may operate as a magnetic shield to eliminate, reduce or otherwise alter the magnetic field in the environment in the vicinity of selected portions of the first patterned layer 348. FIG. 20(b) depicts a cross-sectional top view of an embodiment of the magnetic sensor of FIG. 20(a), showing greater detail of an embodiment of the second patterned layer 352. The second patterned layer 352 also may include a plurality of segments 354. Each of the segments 354 may align vertically with a corresponding one of a subset of the segments 350 of the first patterned layer 348. Each segment 354 may channel or focusing the magnetic flux to shield the corresponding segment of the first patterned layer 348 from the magnetic field. The second patterned magnetic layer 352 may include a second material having a relatively high permeability to magnetic fields, such as a permeability above a predetermined threshold, e.g., a soft magnetic material. The segments of the second patterned layer may occupy a larger surface area, from the perspective of a top or bottom view, than the corresponding segments of the first patterned layer, in order to provide more effective shielding of those segments of the first patterned layer.

The magnetic structure may thus be used to provide both regular and magnetoresistors from the same patterned layer of material. A first subset of segments of the first patterned layer 348 aligned with segments of the second patterned layer 352, despite including material such as magnetoresistive material, may provide a corresponding resistor in the magnetic sensor with no or a reduced sensitivity to the magnetic field about the sensor, such as the first and fourth resistors R1, R4 in FIG. 19, due to the presence of the magnetic shielding provided by the second patterned layer. A second subset of segments of the first patterned layer 348 not aligned with segments of the second patterned layer 352 may provide magnetoresistors in the magnetic sensor with a sensitivity to the magnetic field, such as the second and third resistors R2, R3 in FIG. 19, due to including material such as magnetoresistive material without the presence of the magnetic shielding provided by the second patterned layer. Providing both regular and magnetoresistors from the same patterned layer of material may simplifying the fabrication of the magnetic device by eliminating the need for a second resistive material and corresponding additional fabrication steps.

Figure 20D:
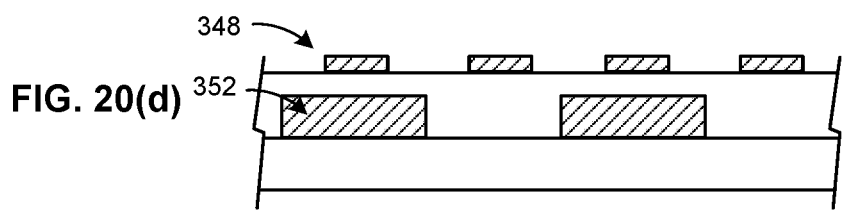
Figure 25A:
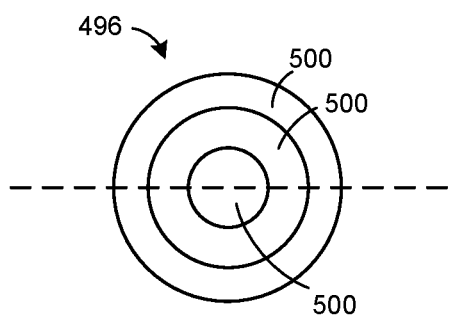
FIGS. 25(*a*)-25(*d*) are cross-sectional side views depicting embodiments of the magnetic device at stages of fabrication to form a magnetic structure in and about a recess on a substrate.
Figure 25C:
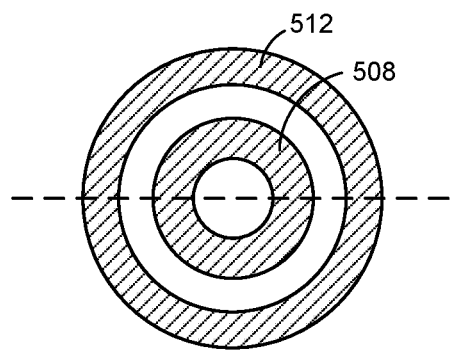
Figure 25B:
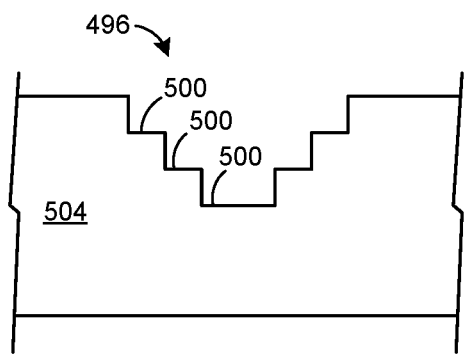
Figure 25D:
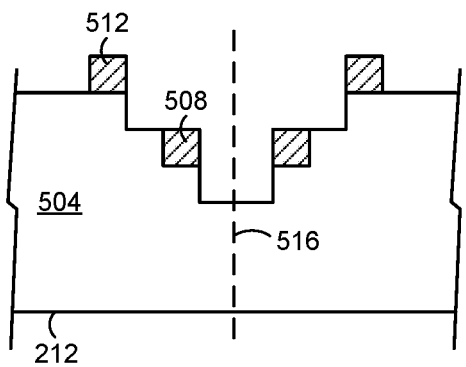
Figure 26A:
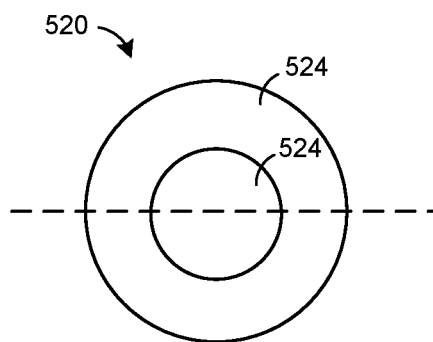
FIGS. 26(*a*)-26(*d*) are cross-sectional side views depicting embodiments of the magnetic device at stages of fabrication to form a magnetic structure in and about a recess on a substrate.
Figure 26C:
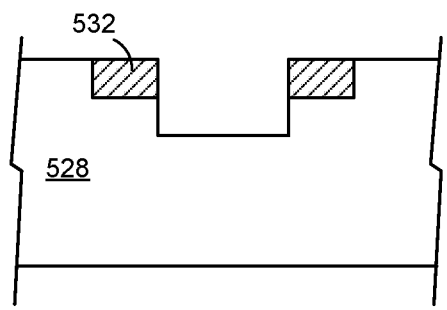
Figure 26B:
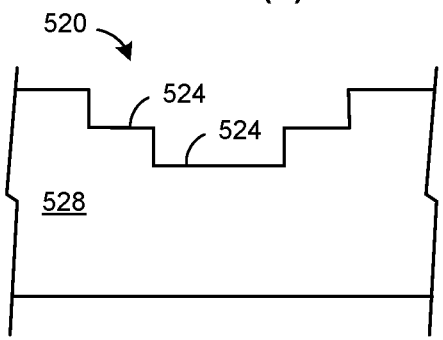
Figure 26D:
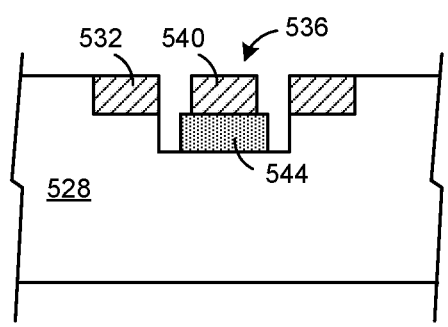

The different layers of patterned material may be provided in different stacking orders. FIG. 20(d) depicts a cross-sectional side view of another embodiment of a magnetic sensor having the first patterned layer of material 348 formed on a surface of a layer formed on a substrate above a second patterned layer of material 352 formed on a surface of another layer formed on a substrate.

The first and second patterned layers also may include different shape and geometrical configurations, such as any of the shape configurations depicted in FIGS. 2(a)-2(k), and various alignments of the first and second patterned layers relative to each other. FIGS. 20(e)-20(f) depict top views of another embodiment of first and second patterned layers 355, 357 of a magnetic sensor similar to that of the embodiments of FIG. 20(a)-20(d), but in which the first and second patterned layers may have different shape and geometrical configurations. In FIG. 20(f), the first patterned layer 355 may have a shape similar to that of FIG. 2(d), in which a first subset of rectangular portions are arranged in a first array in a first orientation and a second subset of rectangular portions are arranged in a second array in a second orientation rotated 90° relative to the first orientation. In FIG. 20(e), the second patterned layer 357 may have a single shape overlying an entire subset of the rectangular portions.

The magnetic sensor may include other elements, such as conductors, which are show in schematic form in FIG. 20(c), as well as conductive striping to enhance or select direction of sensitivity. Embodiments of magnetic sensor also may include different electrical configurations.

The magnetic device may include a first patterned layer and a second patterned layer arranged relative to each other similar to as shown in FIG. 20(a) but to produce other selected magnetic functionality. The first patterned layer may include a material having a selected magnetic property such as, e.g., a magnetoresistive material or a material producing a temporary or permanent magnetic field. The second patterned layer may include magnetically shielding material, such as a material having a permeability to magnetic fields above a predetermined threshold. Each of the first and second patterned layers may have any of the patterned layer properties discussed herein, such as any of the patterned layer shapes discussed in regard to FIGS. 2(a)-2(k). Additionally, one or both of the first or second patterned layers may have the inverse of such shapes, i.e., may occupy only an area outside of these shapes. Different combinations of the first and second patterned layers may produce different selected magnetic functionality. For example, in embodiments similar to that shown in FIG. 20(a), the first patterned layer may include specific patterned layer shapes and the second patterned layer may include a subset of substantially the same shapes or such a subset scaled to a predetermined degree larger or smaller. Such embodiments may be useful to provide magnetic and other functionality using the same first patterned layer. In other embodiments, the first patterned layer may include specific patterned layer shapes and the second patterned layer may include inverse shapes. Such embodiments may be useful to allow magnetic fields to reach the first patterned layer but not other components such as circuitry that may be adjacent, in between, or have some other spatial relationship to the first patterned layer.

The magnetic device also may include a plurality of magnetic structures stacked on top of each other on a substrate. FIG. 21 depicts a side view of an embodiment of a magnetic device including a plurality of stacked magnetic structures. The magnetic device may include a first magnetic structure 358 stacked on top of a second magnetic structure 362. The stacked first and second magnetic structures 358, 362 may be stacked on top of another device structure such as a substrate 366. The stacked magnetic structures 358, 362 may be separated by one or more insulating or shielding layers 370, 374. Each of the stacked magnetic structures 358, 362 may include a layer of material 378, 382 having selected magnetic properties formed on a substrate 386, 390.

The magnetic device also may include a magnetic structure formed in or at least partially in a recess in a substrate or a recess in one or more layers on a substrate. FIGS. 22(a)-22(b) depict embodiments of a magnetic device at a first stage of fabrication, after a substrate 394, 398 is provided that includes one or more recesses 402, 406 formed in the substrate 394, 398 or in one or more layers on the substrate 394, 398. The one or more recesses 402, 406 may be shaped to have the same shape as or encompass shapes of a magnetic layer. The substrate 394, 398 may be processed to produce the one or more recesses 402, 406, such as by removing material from the substrate 394, 398 or layer on the substrate by one or more of etching, sputtering, etc. FIGS. 22(c)-22(d) depict embodiments of the magnetic device at a second stage of fabrication, after a patterned layer 410, 414 of material having a selected magnetic property has been formed in the one or more recesses shown in FIGS. 22(a)-22(b). The shapes of the patterned layers 410, 414 may be the same as the shapes of the recesses. Alternatively, a recess may contain a layer having a different shape or a layer having a plurality of shapes.

The magnetic structure also may conformally coat or at least partially conformally coat one or more recess. FIG. 23(a) depicts an embodiment of a magnetic device at a first stage of fabrication, in which a plurality of recesses 415 are formed in a substrate or in one or more layers on the substrate. The plurality of recesses may be separated from each other by non-recessed surfaces 417, such as according to a periodic separation distance. FIG. 23(b) depicts an embodiment of the magnetic device at a second stage of fabrication, in which a patterned layer 419 has been formed to conformally coat an area including the recesses and separating surfaces. The patterned layer alternatively may coat only a partial portion of the area including the recesses and separating surfaces. FIG. 23(c) depicts another embodiment of the magnetic device at a second stage of fabrication, in which a patterned layer 421 has been formed to conformally coat a partial portion of the area including the recesses and separating surfaces. This partial coating may be formed directly by forming the coating only in the partial area, or alternatively by forming a coating such as depicted in FIG. 23(b) and subsequently removing a portion of the coating. The patterned layer also may coat only a portion of the recesses. FIG. 23(d) depicts another embodiment of the magnetic device at a second stage of fabrication, in which a patterned layer 423 has been formed to conformally coat a partial portion of the recesses, such as a bottom surface of the recesses. This partial conformal coating again may be formed directly by forming the coating only in the partial areas, or alternatively by forming a coating such as depicted in FIG. 23(b) and subsequently removing a portion of the coating.

The magnetic device may include conductive wiring arranged about the patterned layer formed in a recess. The conductive wiring may provide a conductive coil or other conductive interconnection about the magnetic layer. The conductive wiring may include one or more of a conductive layer or a through silicon (or other substrate) via (TSV). The conductive layer may include one or more of a horizontal conductive layer or a vertical conductive layer.

FIGS. 24(a)-24(c) depict embodiments of a magnetic device at a first stage of fabrication, having a substrate 418, 422, 426 in which one or more recesses 430, 434, 438 are formed and one or more TSVs 442, 446, 450 are formed about the recesses 430, 434, 438. FIGS. 24(d)-24(f) depict embodiments of the magnetic device of FIGS. 24(a)-24(c) at a second stage of fabrication, in which a patterned layer 454, 458, 462 has been formed in the one or more recesses 430, 434, 438. FIGS. 24(g)-24(i) depict embodiments of the magnetic device of FIGS. 24(a)-24(f) at a third stage of fabrication, in which one or more conductive layers 466, 470, 474 have been formed between the TSVs 442, 446, 450 over the material 454, 458, 462 in the one or more recesses 430, 434, 438. Another conductive layer may be formed at a lower layer or on the back side of the substrate to complete interconnection of the conductive wiring, such as to form conductive coils about the material 454, 458, 462.

Conductive wiring about the patterned layer of material may form a conductive coil having a variety of configurations and for a variety of purposes. A conductive coil about the material may be used to generate or reinforce a magnetic field in the material. A conductive coil about the patterned layer also may be used to set, such as to initialize or change the direction of, a magnetization of the material, such as a magnetization of an anisotropic magnetoresistive material used to implement a magnetoresistor. The conductive coil may include one or more windings about one or more separate segments of the patterned layer at one or more locations of the segments. For example, in FIG. 24(*g*), the conductive coil may include a plurality of windings 478 about a single separate segment of the patterned layer. In FIG. 24(*h*), the conductive coil may include a plurality of windings 482, 484 about each of a plurality of separate segments of the patterned layer. In FIG. 24(*i*), the conductive coil may include a first plurality of windings 488 about a first location of a single continuous segment of the patterned layer, and a second plurality of windings 492 about a second location 482 of the single continuous segment of the patterned layer. The first and second pluralities of windings 488, 492 optionally may be used to provide magnetic fields to the first and second locations of the segment in different directions. The first and second locations of the single segment of the patterned layer optionally may be used to produce, conduct, channel or concentrate magnetic flux in different directions.

One or more patterned layer of material having a selected magnetic property may be formed at a plurality of levels in and about a recess. FIGS. 25(*a*)-25(*b*) depict top and cross-sectional side views of an embodiment of a magnetic device at a first stage of fabrication, in which a recess 496 having a plurality of levels 500 is formed in a substrate 504. Each of the plurality of levels 500 of the recess 496 may include a surface. Each surface may be parallel to a primary plane of the substrate 504. Each surface also may be offset from other level surfaces by an inter-level distance. FIGS. 25(*c*)-25(*d*) depict top and cross-sectional side views of the magnetic device of FIGS. 25(*a*)-25(*b*) at a second stage of fabrication, in which a plurality of patterned layers of material are formed at a plurality of levels in and about the recess 496. The patterned layers may include one or more patterned layers 508 formed inside the recess on a surface of one of the levels 500 inside the recess 496. Although the exemplary embodiment of FIGS. 25(*c*)-25(*d*) depict a single patterned layer at a single level 500 inside the recess 496, other embodiments may include a plurality of patterned layers, each at a different level 500 inside the recess 496. The patterned layers also may include a patterned layer 512 formed on a surface bordering or about the boundary of the recess 496. The patterned layers 508, 512 may have the same shape as the recess 496 or level of the recess 496 on or about which they are formed. The patterned layers 508, 512 may be offset from each other according to the inter-level distances between levels on which they are formed.

Embodiments of the magnetic device may provide functionality based on the presence of the patterned layers at different levels. For example, a plurality of layers provided on different levels offset from each other by inter-level distances may be used to provide magnetic sensing as a function of an axis along which the levels are offset. For example, the magnetic device in FIG. 25(*d*) may provide magnetic sensing as a function of a central axis 516 of the recess 496. This may be useful to sense properties of an object that may enter the recess 496, such as the position of the object with respect to the central axis 516 or the presence or level of a current associated with an object with respect to the central axis 516.

Different types of magnetic structures may be formed in and about a recess. FIGS. 26(*a*)-26(*b*) depict top and cross-sectional side views of an embodiment of a magnetic device at a first stage of fabrication, in which a recess 520 having a plurality of levels 524 is formed in a substrate 528. FIG. 26(*c*) depicts a side cross-sectional view of the magnetic device of FIGS. 26(*a*)-26(*b*) at a second stage of fabrication, in which a patterned layer of material 532 having a selected magnetic property is formed at a level 524 in the recess 520. FIG. 26(*d*) depicts a side cross-sectional view of the magnetic device of FIGS. 26(*a*)-26(*c*) at a third stage of fabrication, in which a magnetic structure 536 is placed at another level 524 in the recess 520. The magnetic structure 536 may include a patterned layer 540 formed on a substrate 544. In FIG. 26(*d*), the patterned layer 532 formed on the level 524 of the recess 520 may be formed at the same vertical height as the patterned layer 540 formed on the substrate 544 placed in the recess 520. However, in other embodiments, the patterned layer 532 on the level 524 in the recess 520 may be at a different vertical height than that of patterned the layer 540 on the substrate 544 in the recess 520.

The magnetic structure may include different shapes or portions of shapes of patterned layers formed at different levels. FIG. 27(*a*) depicts a top view of an embodiment of a magnetic device including patterned layers 548, 552 having a plurality of separate arcuate segments arranged to outline a ring. FIG. 27(*b*) depicts a cross-sectional side view of the magnetic device of FIG. 27(*a*) taken along a first axis passing through a first subset of the segments 556. The first subset of segments 556 may be formed as a first patterned layer 548 on a first surface of a substrate or layer on the substrate. FIG. 27(*c*) depicts a cross-sectional side view of the magnetic device of FIG. 27(*a*) taken along a second axis passing through a second subset of the segments 560. The second subset of segments 560 may be formed as a second patterned layer 552 at a second level in a recess in the substrate or on a layer of the substrate. Forming different shapes or portions of shapes of patterned layers on different levels may provide specific functionality of the magnetic devices, such as specific magnetic sensing properties, resulting from the distribution of geometric shapes to different levels.

Magnetic structures also may be arranged about a recess to provide a magnetic flux concentrator. FIG. 28(*a*) depicts a cross-sectional side view of an embodiment of the magnetic flux concentrator device of FIG. 17(*a*), in which at least one of the patterned layers of the magnetic flux concentrator may be formed on a surface of a level inside a recess 564. Another of the patterned layers of the magnetic flux concentrator may be formed on a surface about the recess 564. In FIG. 28(*a*), the magnetic sensor also may be formed on a surface about the recess 564. However, in other embodiments, the magnetic sensor also may be formed on a surface of a level inside the recess 564. FIG. 28(*b*) depicts a cross-sectional side view of another embodiment of the magnetic device of FIG. 17(*a*), similar to the embodiment of FIG. 28(*a*), but in which the magnetic sensor may be formed on a surface of a level inside the recess 564. Other embodiments may include further variations of distributions of components of the magnetic flux concentrator and magnetic sensor to different levels in and about a recess.

Other magnetic devices discussed herein also may be configured in and about one or more recesses. For example, one or more of the patterned layers of the magnetic concentrator device of FIGS. 18(a)-18(b) also may be formed in one or more recesses Similarly, one or more of the patterned layers of the magnetic sensor device embodiments of FIGS. 20(a)-20(f) may be formed in one or more recess.

The magnetic structure may be located on a back side of a substrate or in a recess on a back side of a substrate. FIG. 29 depicts a cross-sectional side view of a magnetic device including one or more magnetic structures 568, each located in a corresponding recess 572 in a back side of a substrate 576. Each of the magnetic structures 568 may include a patterned layer 580 formed on a substrate 584. The magnetic device also may include one or more TSVs 588 electrically connecting the magnetic structures to a front side of the substrate, which may include integrated circuitry 592.

The magnetic structure also may include a patterned layer of material having a selected magnetic property formed on an angled surface. The angled surface may be a surface of a walls of a recess. Forming the patterned layer on an angled surface may provide selected functionality as a function of the angle of the surface, such as enabling one or more of vertical or three-dimensional sensitivity for a magnetic sensor formed from such layers.

FIG. 30(a) depicts a cross-sectional side view of an embodiment of a magnetic device including a patterned layer 596 formed on an angled surface 600 of a wall of a recess 604 in a substrate 608. The surface 600 may be configured to have a predetermined angle relative to a primary plane of the substrate 608 or a surface of a layer on the substrate 608. FIG. 30(b) depicts a top view of an embodiment of the magnetic device depicted in FIG. 29(a). The layer 596 may be patterned to form, e.g., a magnetic sensor. The recess 604 may have the same shape as or encompass the patterned layer 596. As with other embodiments discussed herein, the patterned layer 596 may have any of the patterned layer properties discussed herein, such as any of the patterned layer shapes discussed herein regard to FIGS. 2(a)-2(k).

The magnetic structure also may include patterned layers formed on a plurality of different angled surfaces. FIG. 31(a) depicts a cross-sectional side view of an embodiment of a magnetic device including a plurality of patterned layers 612, 616, each formed on a different angled surface 620, 624 of a wall of a recess 628 in a substrate 632. Each of the surfaces 620, 624 may be configured to have a corresponding predetermined angle relative to a primary plane of the substrate 632 or a surface of a layer on the substrate 632. The predetermined angle for each wall optionally may be different than that of the other walls. FIG. 31(b) depicts a top view of an embodiment of the magnetic device depicted in FIG. 31(a). The layers 612, 616 may be patterned to form, e.g, a magnetic sensor. The recess 628 may be shaped to have the same shape as or encompass the patterned magnetic layers 612, 616.

A plurality of patterned layers may be formed on a plurality of different angled surfaces of a plurality of different recesses. FIG. 32 depicts a top view of another embodiment of a magnetic device including a plurality of patterned layers 636, 640, 644, 648, each formed on a different angled surface 652, 656, 660, 664 forming a wall of a different recess. Each of the patterned layers 636, 640, 644, 648 may include a plurality of separate segments oriented in a different directions.

Figure 33A:
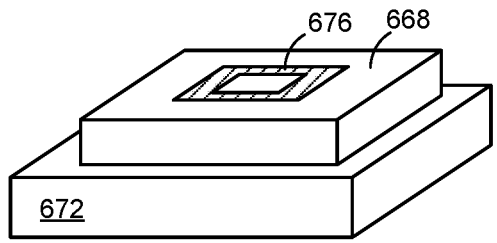
FIGS. 33(*a*)-33(*d*) are perspective and cross-sectional side views depicting embodiments of the magnetic device including a magnetic structure on a cap on a substrate.
Figure 33B:
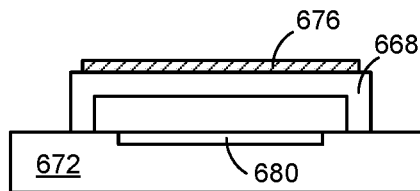

The magnetic structure also may be formed on a cap mounted on a substrate. FIGS. 33(a)-33(b) depict perspective and cross-sectional side views of an embodiment of a magnetic device having a magnetic structure formed on a cap 668 mounted on a substrate 672. The magnetic structure may include a patterned layer of material 676 having a selected magnetic property formed on a surface or in a recess of the top portion of the cap 668. The cap 668 may be mounted on the substrate 672 over a substrate structure 680 to partially or completely enclose a volume about the substrate structure 680 from the environment outside the cap 668. The cap 668 may include the top portion located over the substrate structure 680 and sidewalls extending from the top portion to the substrate 672. The cap 668 may optionally be a capping substrate formed from another substrate. The substrate structure 680 may be located under the cap 668. The substrate structure 680 may include one or more of integrated circuitry, a micromechanical structure, a sensor structure, or another magnetic structure, etc.

Figure 33C:
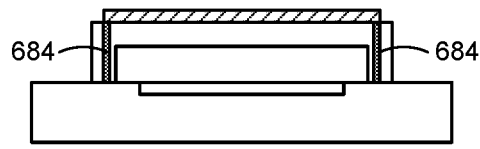
Figure 33D:
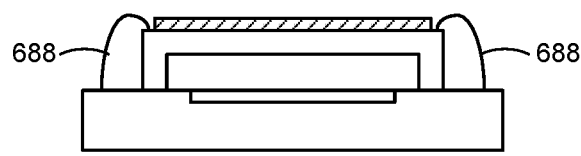

The magnetic device also may include conductive wiring to electrically interconnect the magnetic structure on the cap with the circuit structure under the cap. FIG. 33(c) depicts a cross-sectional side view of an embodiment of the magnetic device similar to the embodiment of FIGS. 33(a)-33(b), but which includes one or more TSVs 684 extending through the cap from the top surface of the cap to the substrate under the cap. The TSVs 684, optionally along with one or more conductive layers, may electrically interconnect the magnetic structure with the substrate structure under the cap. FIG. 33(d) depicts a cross-sectional side view of another embodiment of the magnetic device similar to the embodiment of FIGS. 33(a)-33(b), but which may include one or more wire bonds 688 extending from the top surface of the cap to the substrate to electrically interconnect the magnetic structure on the cap to the substrate structure under the cap.

Figure 34A:
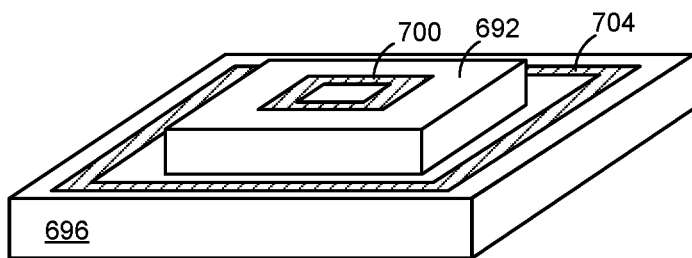
FIGS. 34(*a*)-34(*b*) are perspective and cross-sectional side views depicting embodiments of the magnetic device including magnetic structures on and about a cap on a substrate.
Figure 34B:
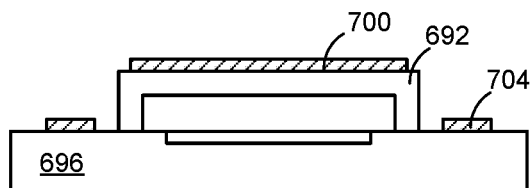

Magnetic structures also may be formed at a plurality of different levels on and about a cap. FIGS. 34(a)-34(b) depict perspective and cross-sectional side views of an embodiment of a magnetic device having magnetic structures formed at a plurality of different levels on and about a cap 692 mounted on a substrate 696. A first magnetic structure may include a first patterned layer 700 formed at a first level on the cap 692 as discussed above in regard to FIGS. 33(a)-(d). A second magnetic structure may include a second patterned layer 704 formed at a second level on or in a recess in the substrate 696 about the cap 692. The first level may be offset from the second level by a predetermined distance. The first and second magnetic layers 700, 704 may have a common shape, such as concentric rings or aligned square or rectangular shapes. The second layer 704 may partially or wholly surround the cap 692.

As with other embodiments discussed herein, a patterned layer formed on a cap may have a selected magnetic property to provide a selected magnetic functionality. In embodiments, the patterned layer may include a magnetoresistive material arranged to form a magnetic sensor. In other embodiments, the patterned layer may include a material producing a temporary or permanent magnetic field. In yet other embodiments, the patterned layer may include a magnetically shielding material, such as a material having a permeability to magnetic fields above a predetermined threshold.

Figure 35:
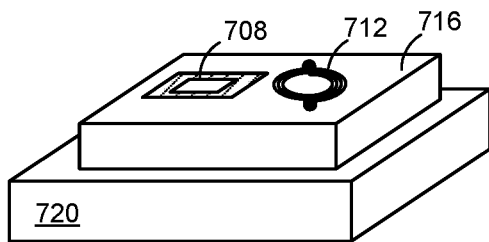
FIG. 35 is a perspective view depicting an embodiment of the magnetic device including a magnetic structure and a coil on a cap on a substrate.

Other structures may be formed on the cap in addition to the magnetic structure. FIG. 35 depicts an embodiment of a magnetic device including a magnetic structure 708 and a conductive coil 712 formed on a cap 716 mounted on a substrate 720. The conductive coil 712 may be formed in separate area from the magnetic structure 708, as in FIG. 35, or may be formed under or above the magnetic structure. A conductive coil formed in a separate area may provide, e.g., a radio-frequency identification structure. A conductive coil formed below or above the magnetic structure may be used to provide a magnetic field to set or modify the magnetic properties of the magnetic structure.

Figure 36A:
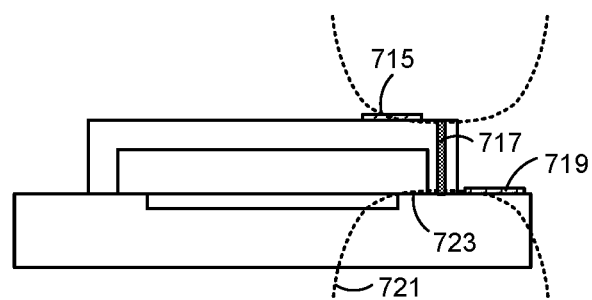
FIGS. 36(*a*)-36(*b*) are cross-sectional side views of embodiments of the magnetic device including magnetic sensors and a magnetic flux concentrator in, on and about a cap on a substrate.

The magnetic device also may provide a magnetic flux concentrator on or in the cap. FIG. 36(a) depicts an embodiment of a magnetic device including a first magnetic structure forming a magnetic flux concentrator and one or more second magnetic structures forming one or more magnetic sensors in and about a cap mounted on a substrate. The magnetic flux concentrator may include patterned layer of a material 717 deposited in a sidewall of the cap. The patterned layer may extend substantially to the top and bottom of the sidewall, or to within a predetermined distance of the top and bottom. The patterned layer of the magnetic flux concentrator may be formed along a substantially vertical plane. The one or more magnetic sensors may include a patterned layer of material 715, 719 formed on the cap and/or on the substrate. The patterned layers may be formed within a predetermined distance of the ends of the patterned layer of the magnetic flux concentrator. The patterned layers of the magnetic sensors may be formed along a substantially horizontal plane. The patterned layer of the magnetic flux concentrator may include a material having a relatively high permeability to magnetic fields, such as a permeability above a predetermined threshold, and the patterned layers of the magnetic sensors may include a magnetoresistive material.

In operation, the magnetic flux concentrator may channel or concentrate magnetic flux as it travels in a vertical direction 721 in an area above and below the patterned layer into the patterned layer. This channeling or concentrating may produce localized translation of the magnetic flux from a vertical direction or similar directions to a horizontal direction or similar directions 723 near the ends of the magnetic flux concentrator where the magnetic sensors are located. Channeling and/or concentrating of the magnetic flux may enable the magnetic sensor to sense a vertical magnetic field using an operational sensitivity to magnetic fields along the horizontal direction instead of the vertical direction.

Figure 36B:
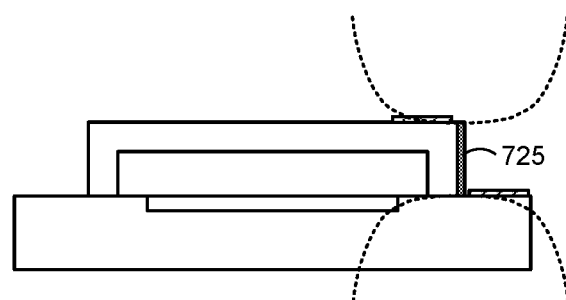

FIG. 36(b) depicts another embodiment of a magnetic device similar to the embodiment of FIG. 36(a), but in which a magnetic flux concentrator may include patterned layer of a material 725 deposited on a surface of the sidewall of the cap.

Additionally, the magnetic structure may be formed on the cap according to any of the embodiments of the magnetic structure formed on a substrate discussed herein, such as in regard to FIGS. 7 to 44 and their various subfigures (i.e., (a), (b), etc.), among other embodiments, with the cap being the substrate and having corresponding substrate structures.

The magnetic structure also may include a patterned layer formed on or as part of a micromechanical structure. The micromechanical structure may include one or more of a variety of different structures, including one or more of a beam, a plate, a comb, a diaphragm, or a gear, etc. The patterned layer may form part or all of a mechanically active portion of the micromechanical structure.

Figure 37A:
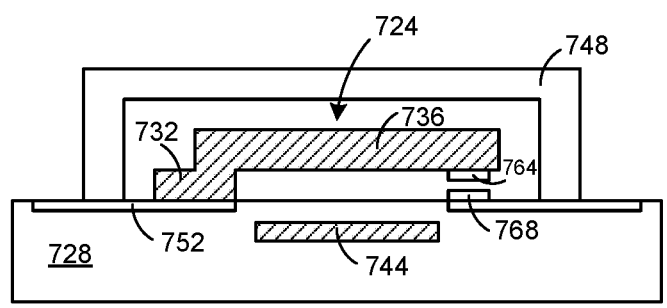
FIGS. 37(*a*)-37(*c*) are cross-sectional side view of embodiments of the magnetic device including a magnetic structure including at least part of a micromechanical structure.
Figure 37B:
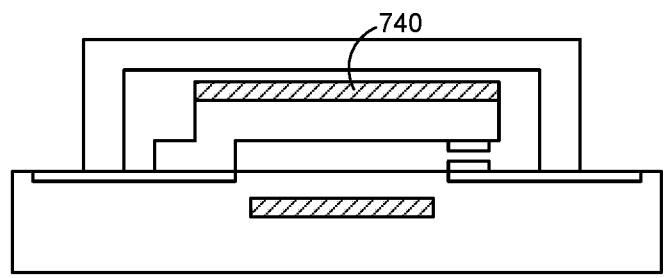

FIG. 37(a) depicts an embodiment of a magnetic device including a magnetic structure having a patterned layer forming a micromechanical beam 724 suspended from a substrate 728. The beam 724 may be a cantilever including an anchor portion 732 connecting the beam 724 to the substrate 728 and a suspended portion 736 suspended over another portion of the substrate 728. The suspended portion 736 of the beam 724 may be flexible, and may be configured to bend toward and away from the substrate in response to stimuli. The patterned layer may include a material that produces a permanent or temporary magnetic field. The patterned layer may form substantially the entire beam 724, including both the anchor portion 732 and the suspended portion 736, as shown in FIG. 37(a). However, the patterned layer of the magnetic structure alternatively may form only a part of the micromechanical device. FIG. 37(b) depicts another embodiment of a magnetic device similar to the embodiment depicted in FIG. 37(b), but in which a patterned layer may form only a part of the micromechanical device, such as a patterned layer 740 on a suspended portion of a beam, which may be formed form another material, such as an oxide, polysilicon or other material.

The magnetic device also optionally may include another magnetic structure including a patterned layer 744 formed under the micromechanical structure on, in, or in a recess of the substrate 728. The patterned layer may include a material that produces a permanent or temporary magnetic field. The second magnetic structure may interact magnetically with the magnetic structure of the micromechanical structure 724. Other embodiments may omit the second magnetic structure 744 formed under the micromechanical structure 724.

The magnetic device may further include a cap 748 mounted on the substrate 728 about the micromechanical structure 724. The cap 748 may partially or wholly enclose the micromechanical structure 724 to protect the micromechanical structure 724 from the environment about the magnetic device.

Figure 37C:
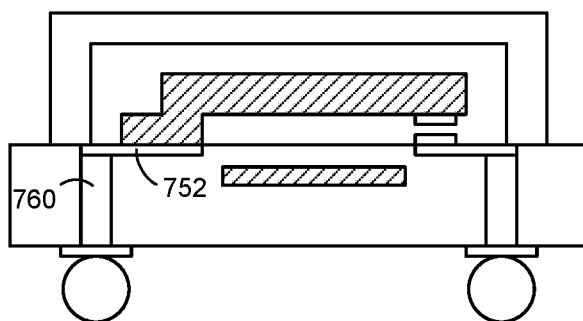

The magnetic device also may include conductive wiring to electrically interconnect the micromechanical structure to other device components. The conductive wiring may include a conductive layer 752 electrically interconnecting the magnetic structure to other locations on the same side of the substrate 728 as the micromechanical structure 724, as shown in FIG. 37(a). The conductive wiring also may include one or conductive layers and TSVs interconnecting the micromechanical device to locations on the opposite side of the substrate. FIG. 37(c) depicts another embodiment of a magnetic device similar to the embodiment depicted in FIG. 37(a), but in which the magnetic device may include one or conductive layers 756 and TSVs 760 interconnecting the micromechanical device to locations on the opposite side of the substrate.

In operation, the micromechanical beam structure depicted in FIGS. 37(a)-37(c) may provide a variety of functionality, such as operating as a switch, a sensor, etc. For example, the micromechanical beam structure may operate as a magnetic switch such as a reed relay to make an electrical interconnection between a conductive contact 764 at a free end of the beam 724 and a second conductive contact 768 on the substrate 728 under the free end of the beam 724 in response to external stimuli such as a magnetic field. The micromechanical beam structure also may be used to detect external magnetic fields as a function of the deflection of the beam structure in response to such fields. The micromechanical beam structure further may be used to produce selectively changing magnetic fields by moving the beam structure in response to a stimuli such as a magnetic field or acceleration. A selectively changing magnetic field may be used in various applications such as, e.g., implementing an isolated data link.

Figure 38A:
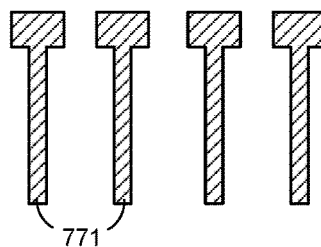
FIGS. 38(*a*)-38(*b*) are top views depicting embodiments of a magnetic structure including at least part of a plurality of micromechanical structures.
Figure 38B:
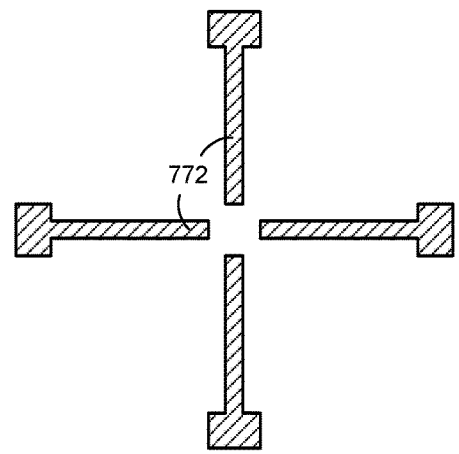

The magnetic device may include a plurality of micromechanical structures formed in part or in whole from magnetic structures. FIGS. 38(a)-38(b) depicts top views of embodiments of a magnetic device including a plurality of micromechanical beams 771, 772 formed from patterned layers similar to as shown in FIGS. 37(*a*)-37(*b*). In FIG. 38(*a*), the plurality of beams 771 may be arranged adjacent to each other, in a same spatial orientation, in a one dimensional array. In FIG. 38(*b*), the plurality of beams 772 may be arranged with spatial orientations at angles relative to each other, such as at angles of 90° or 180°. The plurality of micromechanical structures may be arranged relative to each other to implement various devices, such as, e.g., an interconnected array of magnetic switches. For example, the embodiment of FIG. 38(*a*) may be used to detect or otherwise provide functionality as a function of a variation of a magnetic field along the array of beams. The embodiment of FIG. 38(*b*) may be used to detect or otherwise provide functionality as a function of a directionality of a magnetic field relative to the array of beams as a whole.

Figure 39A:
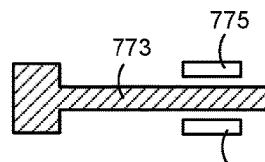
FIGS. 39(*a*)-39(*b*) are top and side views of an embodiment of a magnetic structure including at least part of a micromechanical structure.
Figure 39B:
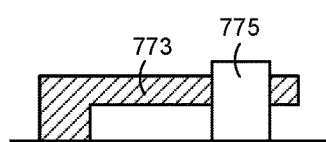

A micromechanical beam structure formed from a magnetic structure also may be configured to bend laterally instead of or in addition to toward and away from the substrate. The micromechanical beam may be configured to bend in a particular direction by dimensioning the beam below a predetermined thickness in that direction to allow flexing of the beam. FIGS. 39(*a*)-39(*b*) depict top and side views of embodiments of a magnetic device including a micromechanical beam 773 formed from a patterned layer similar to as shown in FIGS. 37(*a*)-37(*b*), but in which the beam may be configured to bend laterally from side to side, in a direction parallel to a primary plane of the substrate, instead of or in addition to bending toward and away from the substrate. The magnetic device also may include one or more elements positioned laterally on one or more sides of the beams. The lateral elements may be or include one or more of a movement limiting structure, an electrical contact, or a secondary magnetic structure.

Figure 40:
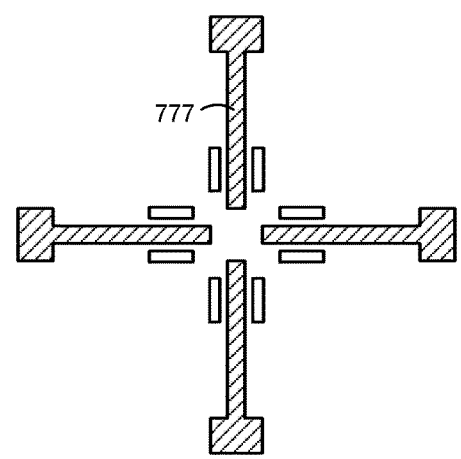
FIG. 40 is a top view depicting an embodiment of a magnetic structure including at least part of a plurality of micromechanical structures.

The magnetic device may include a plurality of micromechanical beams formed from magnetic structures and configured to move laterally. FIG. 40 depicts a top view of an embodiment of a magnetic device including a plurality of micromechanical beams 777 formed from a patterned layer similar to as shown in FIGS. 39(*a*)-39(*b*). The plurality of beams may be arranged in spatial orientations at angles relative to each other, such as at angles of 90° or 180°. In other embodiments, the plurality of beams may be arranged adjacent to each other, in a same spatial orientation, in a one dimensional array, such as similar to as shown in FIG. 38(*a*). As discussed above, a plurality of micromechanical structures may be arranged relative to each other to implement various devices. For example, the embodiment of FIG. 40 also may be used to detect or otherwise provide functionality as a function of a directionality of a magnetic field relative to the array of beams as a whole.

Figure 41A:
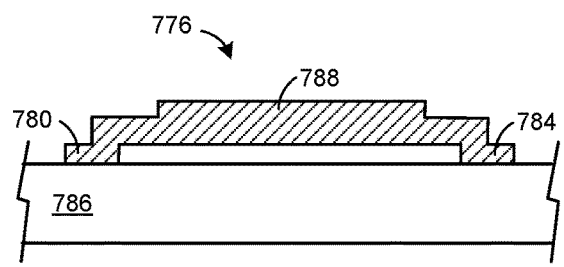
FIGS. 41(*a*)-41(*b*) are cross-sectional side views of embodiments of a magnetic structure including at least part of a micromechanical structure.
Figure 41B:
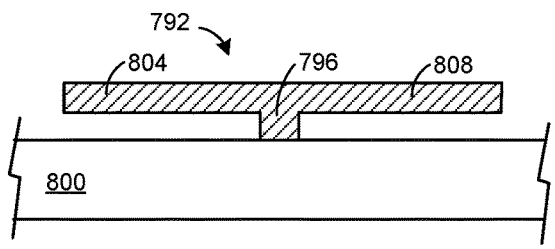

The micromechanical beam formed from the magnetic structure may take forms other than the cantilever beams depicted in FIGS. 37-40. FIG. 41(*a*)-41(*b*) depict side views of additional embodiments of micromechanical beam structures that may be formed from a magnetic structure. In FIG. 41(*a*), the beam structure 776 may include first and second anchor portions 780, 784, at opposite ends of the structure 776, connecting the structure 776 to a substrate 786, and a suspended portion 788 suspended over the substrate 786. In FIG. 41(*b*), the beam structure 792 may include a central anchor portion 796 connecting the structure 792 to a substrate 800, and first and second suspended portions 804, 808 suspended over the substrate 800. In each case, the suspended portion of the beam may be flexible and bend in response to magnetic stimuli.

Although FIGS. 38-41 depict beam structures formed wholly from patterned layers, in other embodiments, these micromechanical beam structures may be formed either in whole or in part from a patterned layer, such as show by comparison in FIGS. 37(*a*)-37(*b*). Additionally, although for clarity of illustration FIGS. 38-41 essentially depict only the plurality of micromechanical structures, the magnetic device also may include other components to enable and/or augment the function of these structures, such as one or more of a cap, electrical connections, second magnetic structure, etc., similar to as shown in FIGS. 37(*a*)-37(*c*).

Figure 42A:
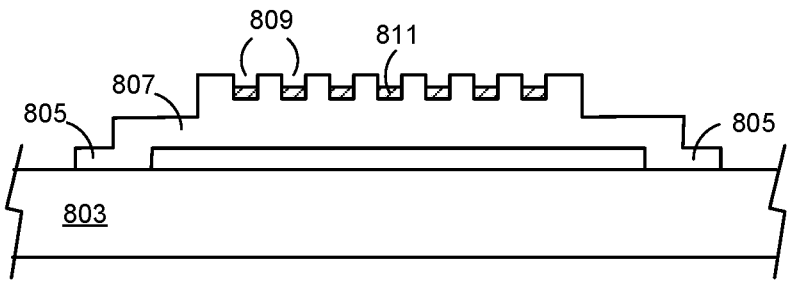
FIGS. 42(*a*)-42(*c*) are cross-sectional side views of embodiments of a magnetic structure formed on a micromechanical structure.
Figure 42B:
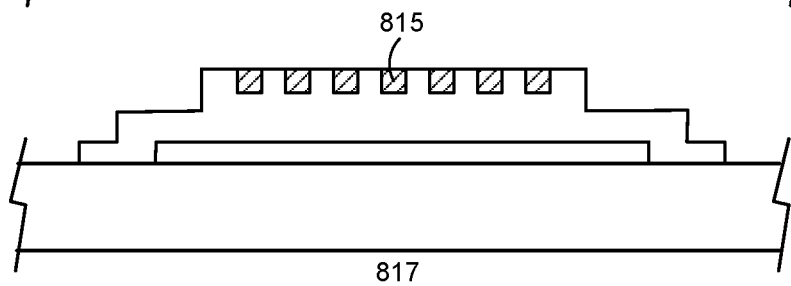
Figure 42C:
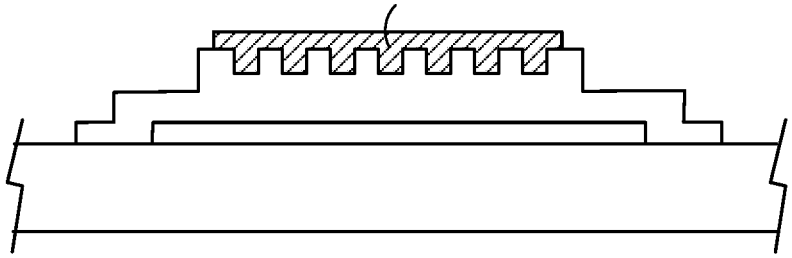

The magnetic structure also may be formed on or as part of other types of micromechanical structures. For example, the magnetic structure may be formed on or as part of a micromechanical diaphragm. FIGS. 42(*a*)-42(*c*) depict cross-sectional side views of a magnetic device including a magnetic structure formed on a micromechanical diaphragm formed on a substrate 803. The diaphragm may include one or more anchor portions 805 connected to the substrate, and a suspended portion 807 suspended over an area of the substrate. The suspended portion may be flexible, and may be configured to bend toward and away from the substrate in response to stimuli. The suspended portion may include one or more recesses 809 in which a patterned layer 811, 815, 817 may be formed. The patterned layer may partially fill the recesses, such as in FIG. 42(*a*), wholly fill the recess, such as in FIG. 42(*b*), or overflow the recess, such as in FIG. 42(*c*). The patterned layer may include a material that produces a permanent or temporary magnetic field.

A cap such as shown in FIGS. 33-37 also may be configured as a micromechanical diaphragm such as shown in FIGS. 42(*a*)-42(*c*).

Figure 43A:
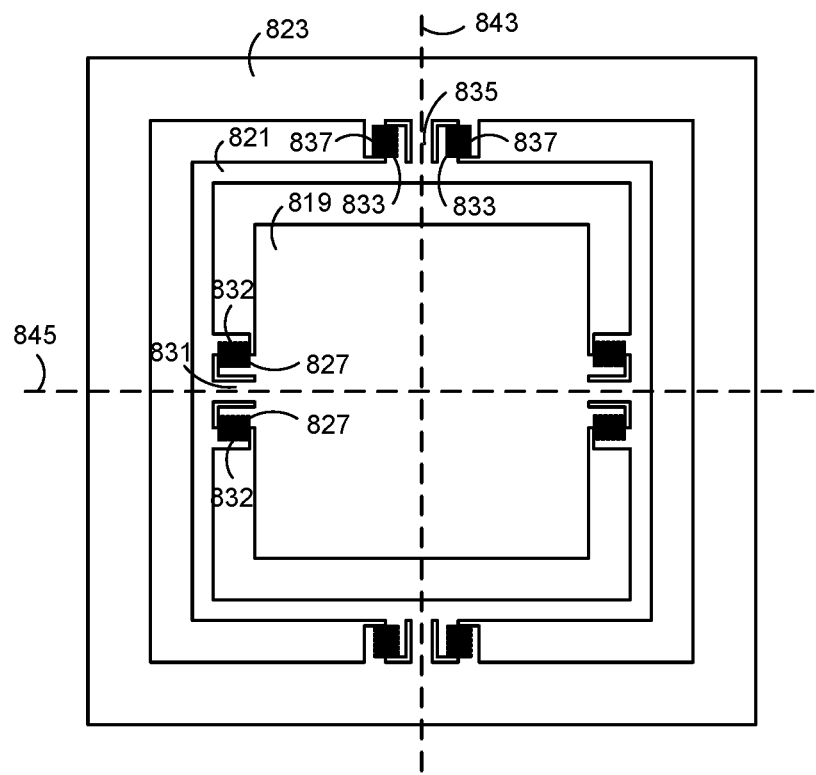
FIGS. 43(*a*)-43(*b*) are top and bottom views of an embodiment of a magnetic structure formed on a micromechanical structure.
Figure 43B:
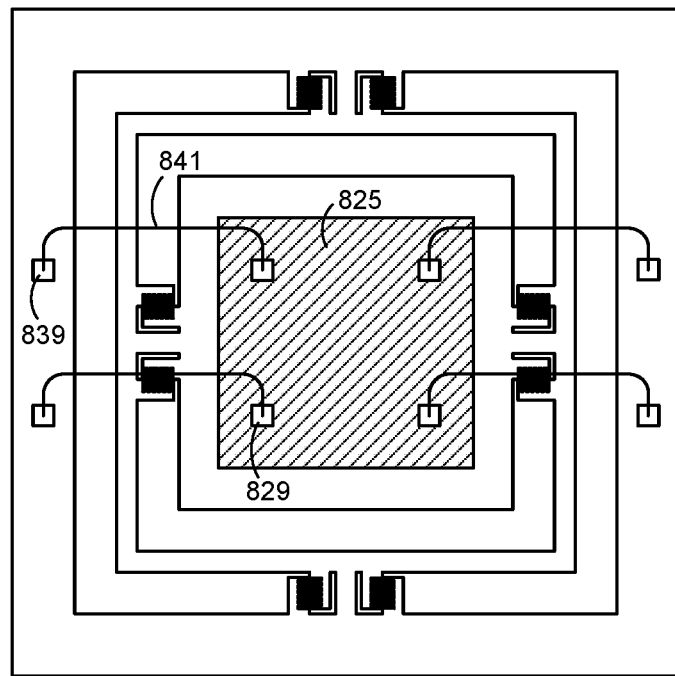

The magnetic structure also may be formed on or as part of other types of micromechanical structures. For example, the magnetic structure may be formed on or as part of a micromechanical scanner. FIGS. 43(*a*)-43(*b*) depict top and bottom views of a magnetic device including a magnetic structure formed on a micromechanical scanner. The micromechanical scanner may include the rotatable platform 819, an inner actuating ring 821, and an outer actuating ring 823. The micromechanical scanner may be formed from a substrate or layers on a substrate.

The rotatable platform may include a top surface on which a layer of material having a selected reflectance may be formed, a bottom surface on which a patterned layer of material 825 having a selected magnetic property and a set of electrical contacts 829 connected to the patterned layer may be formed, and a set of electrostatic actuator components 827 such as drive combs. The rotatable platform may be connected to the inner actuating ring by one or more torsional springs 831. The inner actuating ring may include first and second sets electrostatic actuator components 832, 833 such as drive combs. The inner actuating ring may be connected to the outer actuator ring by one or more torsional springs 835. The outer actuator ring may include a set of electrostatic actuator components 837 such as drive combs, and a set of electrical contacts 839. The electrical contacts of the rotatable platform may be electrically connected to the electrical contacts of the outer actuator ring by a set of bond wires 841. Although shown as having essentially square outlines in FIGS. 43(*a*)-43(*b*), the rotatable platform, inner actuating ring, and outer actuating ring alternatively may be formed to have other outlines, such as rectangular, circular, or elliptical outlines, etc.

The patterned layer may include a magnetoresistive material arranged to form a magnetic sensor. For clarity of illustration, the patterned layer is shown as a single square region in FIG. 43(b), but may instead include any of patterned layer shape configurations discussed herein, such as one or more patterned layer shapes electrically interconnected and arranged to form a magnetic sensor.

Figure 44A:
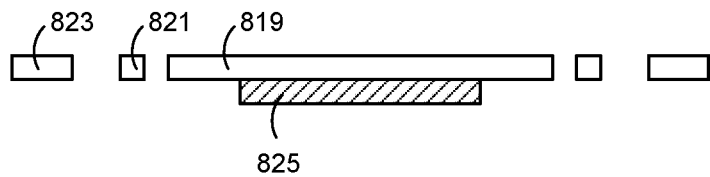
FIGS. 44(*a*)-44(*c*) are cross-sectional side views of an embodiment of a magnetic structure formed on a micromechanical structure.
Figure 44B:
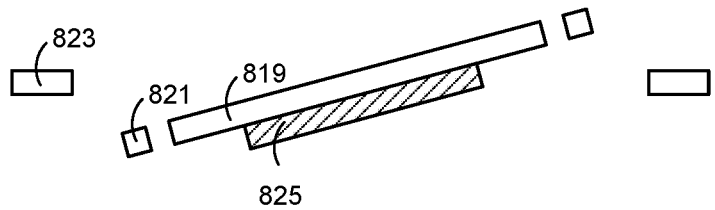
Figure 44C:
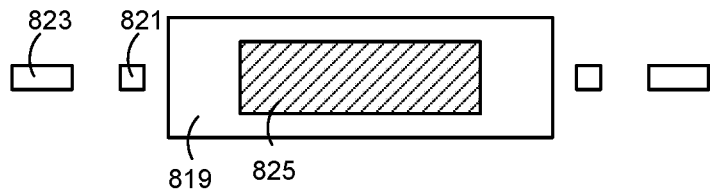

In operation, the rotatable platform may rotate about a first axis 843 in response to the application of electric signals to the electrostatic actuator components of the platform and inner actuator ring. Similarly, the rotatable platform may be rotated about a second axis 845 in response to the application of electric signals to the electrostatic actuator components of the inner actuator ring and the outer actuator ring. FIGS. 44(a)-44(c) depict cross sectional front views of the magnetic device, taken along an axis offset from the torsional springs. In FIG. 44(a), the rotatable platform may be in a quiescent state, with no rotation about either axis. In FIG. 44(b), the rotatable platform may be rotated about the first axis. In FIG. 44(c), the rotatable platform may be rotated about the second axis. The reflective layer may scan a light source such as a laser directed onto the rotatable platform in a corresponding two dimensional pattern. The magnetic sensor may provide an output signal representing the orientation of the rotatable platform by sensing the magnetic field in the environment of the magnetic device, which may have a known orientation relative to the magnetic device as a whole. For clarity of illustration, the bond wires 841 are omitted from FIGS. 44(a)-44(c), however they may be configured to have sufficient size and flexibility to accommodate the rotation of the platform about both axes while still maintaining an electrical connection between the electrical contacts 829 on the rotatable platform and the electrical contacts 839 on the outer ring.

Any of the embodiments of the magnetic device discussed herein may include a magnetic structure having a patterned layer having any of physical connections or arrangements relative to the substrate discussed herein, such as any of the connections or arrangements discussed in regard to any of FIGS. 7 to 44 and their various subfigures (i.e., (a), (b), etc.), among other connections and arrangements.

Figure 45:
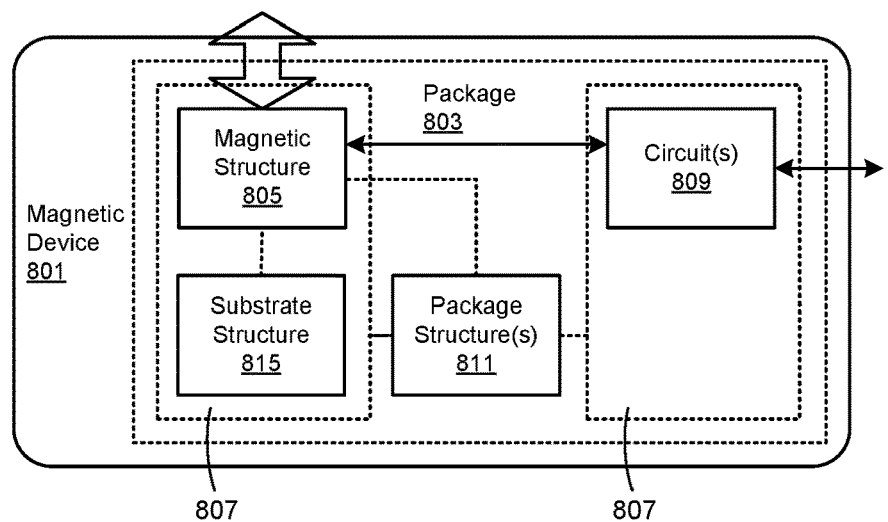
FIG. 45 is a schematic diagram depicting an embodiment of the magnetic device as a packaged magnetic device.

The magnetic device may include a magnetic structure connected to or arranged relative to a structure of a package. FIG. 45 depicts an embodiment of the magnetic device 801 as a packaged magnetic device having the magnetic structure connected or arranged relative to a structure of a package. The magnetic device may include package 803, a magnetic structure 805, one or more substrates 807, and an associated circuit 809.

The package may include one or more package structures 811, such as one or more of an aperture, an enclosure, etc. The magnetic structure may be physically connected or arranged relative to the one or more package structures in a predetermined manner.

The magnetic structure, substrate, substrate structure 815, and circuit of the packaged magnetic device may include any of the embodiments of these components and their interconnections and arrangements discussed above in regard to any other embodiments of the magnetic device, such as discussed above in regard to FIGS. 7 to 44 and their various subfigures (i.e., (a), (b), etc.), among other embodiments.

Figure 46:
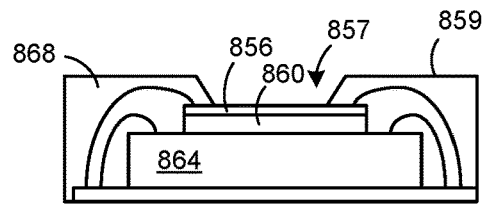
FIG. 46 is a cross-sectional side view depicting an embodiment of a packaged magnetic device.

FIG. 46 depicts an embodiment of a packaged magnetic device. The packaged magnetic device may include the magnetic structure, a package, and the corresponding circuit. The magnetic structure may include a patterned layer 856 formed on a substrate 860. The associated circuit may include an integrated circuit 864 formed on one or more additional substrates. The magnetic structure and its substrate may be attached to the integrated circuit to form a substrate stack.

The package may include an enclosure 868 to selectively expose a portion of the magnetic structure while enclosing other portions of the device. The enclosure may include an aperture 857 to expose a portion of the magnetic structure, such as a surface of the patterned layer or a coated surface of the patterned layer, to an environment external to the package, and an enclosing portion 859 enclosing another portion of one or more of the magnetic structure or the circuit to provide a barrier to the external environment. Exposing the magnetic structure to the external environment may enhance the magnetic performance of the magnetic structure by providing selective access to or from the magnetic structure by a magnetic field. Enclosing the other portion of the magnetic structure or integrated circuit may enhance the electrical performance of the other portion of the magnetic structure or integrated circuit by selectively preventing access to or from the magnetic structure by a magnetic, electric or electromagnetic field, or provide other types of protection from the external environment. The package also may include a conductive lead frame and wire bonds to provide electrical connections between terminals of the package and one or more of the magnetic structure or the integrated circuit.

In other embodiments, a packaged magnetic device may include the magnetic structure and circuit formed together on a single substrate, such as on the same or different sides of such a substrate, that is packaged similarly to as shown in FIG. 42.

Figure 47A:
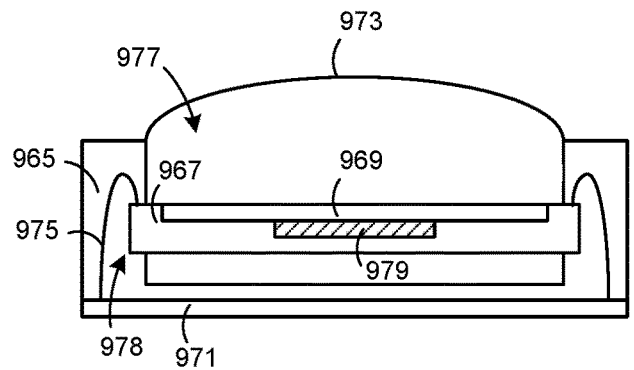
FIGS. 47(*a*)-47(*c*) are cross-sectional side views depicting embodiments of a packaged magnetic device.

FIG. 47(a) depicts a cross-sectional view of another embodiment of a packaged magnetic device, incorporating a magnetic structure formed on or as part of a micromechanical scanner such as shown in FIGS. 43 and 44. The packaged magnetic device may include an enclosure 965, a substrate 967 containing a micromechanical scanner 969 such as shown in FIGS. 43 and 44, a package substrate 971, a lens 973 and one or more electrical interconnections 975. For clarity of illustration, the micromechanical scanner 969 is shown as a single schematic entity, however it may include all of the components shown in FIGS. 43-44. The enclosure may include an aperture 977 to position the lens and admit light to the scanner, and a portion 978 to receive and position the scanner relative to the aperture and lens. The electrical connections, which may include bond wires, may electrically connect the scanner to the package substrate. As discussed above in regard to FIGS. 43 and 44, a patterned layer of magnetoresistive material 979 forming a magnetic sensor may be formed on the scanner.

Figure 47B:
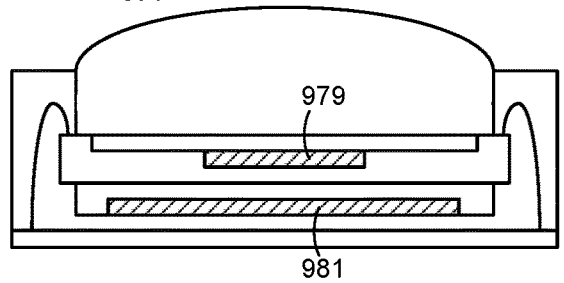
Figure 47C:
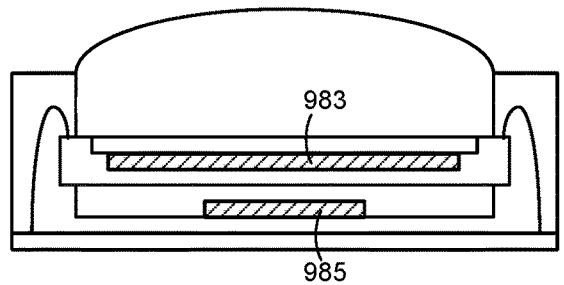

The packaged magnetic device may also include a second patterned layer. The second patterned layer may include a material providing a predetermined permanent or temporary magnetic field. FIGS. 47(b) and 47(c) depict cross-sectional views of embodiments of a packaged magnetic device similar to as shown in FIG. 47(a), but including a second patterned layer. In FIG. 47(b), the second patterned layer 981 may be formed on a portion of the package enclosure or the package substrate. In operation, the second patterned layer may provide a predetermined magnetic field about the scanner, and the magnetic sensor formed form the first patterned layer may provide an output representing the rotational position of the scanner based on the magnetic field sensed by the sensor. In FIG. 47(c), the nature of the patterned layers may be reversed, with a first patterned layer 983 formed on the scanner including a material providing the predetermined magnetic field, and a second patterned layer 985 formed on the package enclosure or package substrate including a magnetoresistive material forming a magnetic sensor. Such an embodiment may operate according to similar principles as for the embodiment of FIG. 47(*b*), but with the generating and sensing of magnetic fields performed at interchanged locations.

Figure 48:
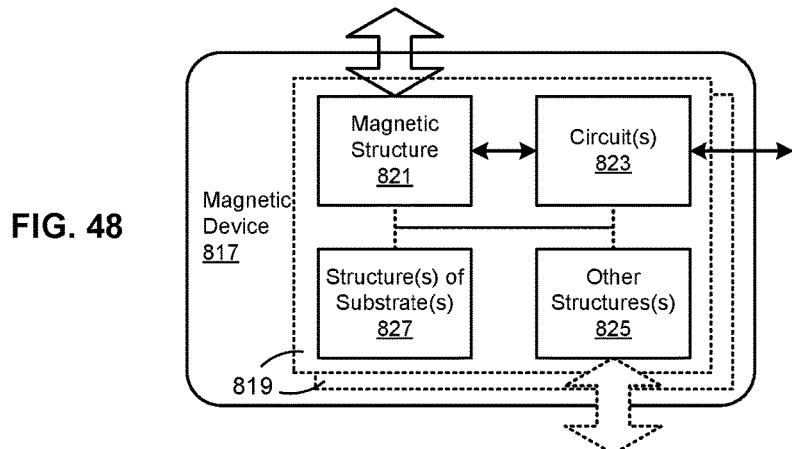
FIG. 48 is a schematic diagram depicting an embodiment of the magnetic device as a magnetic module.
Figure 49A:
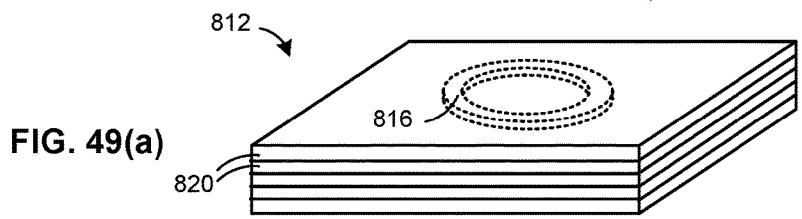
FIG. 49(*a*)-49(*d*) are perspective and cross-sectional side views depicting embodiments of a magnetic module.
Figure 49B:
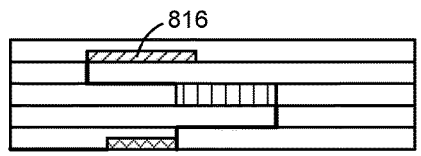
Figure 49C:
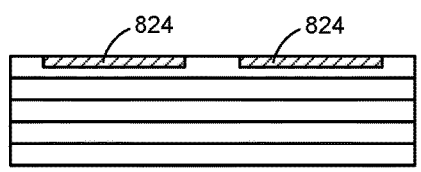
Figure 49D:
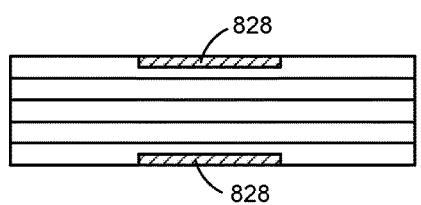

The magnetic device may include a magnetic structure connected to or arranged relative to a structure of a module incorporating a plurality of substrates. FIG. 48 depicts an embodiment of a magnetic device 817 as a module-based magnetic device. The magnetic device may include a plurality of substrates 819, a magnetic structure 821, and an associated circuit 823. The magnetic device also may optionally also include one or more other structures 825, such as a coil, cap, micromechanical structure, antenna, etc.

The magnetic structure may be physically connected or arranged relative to one or more structure 827 of one or more of the module substrates. For example, the magnetic structure may be physically connected or arranged relative to structures of one or more of the module substrate according to any of the embodiments of the magnetic structure and substrates and their interconnections and arrangements discussed above in regard to substrate-based magnetic device, such as discussed above in regard to FIGS. 7 to 44 and their various subfigures (i.e., (a), (b), etc.), among other embodiments. In embodiments, the magnetic structure may be formed on one of the substrates according to any of these embodiments, while the plurality of substrates may include a further plurality of substrates connected to an arranged relative to the magnetic structure and first substrate as discussed below.

The magnetic structure, substrate, circuit and other structures of the module magnetic device may include any of the embodiments of these components and their interconnections and arrangements discussed above in regard to other magnetic device embodiments.

FIG. 49(*a*) depicts a perspective view of an embodiment of a module 812 that may include one or more magnetic structures (or magnetic structures on substrates) 816 and a substrate structure having a plurality of substrates 820. FIG. 49(*b*) depicts a cross-sectional side view of the module shown in FIG. 49(*a*). The substrate structure may include a plurality of substrates 820 layered on top of each other. In embodiments, the substrate structure may be a laminated substrate structure including a plurality of laminated layers.

The one or more magnetic structures may be attached to a substrate of the substrate structure. The magnetic structure 816 may be attached to a substrate of the substrate structure so that the magnetic structure fully embedded within the substrate structure, as shown in FIG. 49(*b*). Alternatively, the magnetic structure may be attached to a substrate of the substrate structure so that the magnetic structure is exposed at an external surface of the module. FIG. 49(*c*)-49(*d*) depict cross-sectional side views of embodiments of the magnetic module similar to that shown in FIG. 49(*a*)-49(*b*), but in which the magnetic structure may be attached to a substrate of the substrate structure so that the magnetic structure, such as a surface of a patterned layer or a coated surface of a patterned layer, is exposed at an external surface of the module. In FIG. 49(*c*), a plurality of magnetic structures 824 may be attached to a substrate of the substrate structure so that the magnetic structures, such as surfaces of patterned layers or coated surfaces of patterned layers, are exposed at an external surface on a same side of the module. In FIG. 49(*d*), a plurality of magnetic structures 828 may be attached to substrates of the substrate structure so that the magnetic structures, such as surfaces of patterned layers or coated surfaces of the patterned layers, are exposed at external surfaces on different, such as opposing, sides of the module.

The module also may include one or more components attached to the substrates of the substrate structure in addition to the magnetic structure. The components may be electrically connected to the magnetic structure by one or more of conductive traces or vias laid along or through the substrates.

Figure 50A:
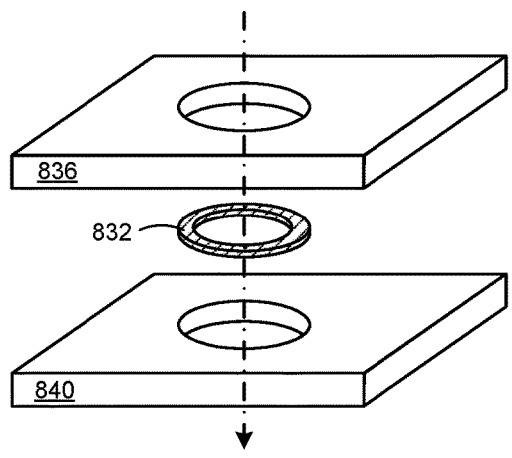
FIGS. 50(*a*)-50(*b*) are exploded perspective and side views of a magnetic structure aligned to apertures in a plurality of substrates.
Figure 50B:
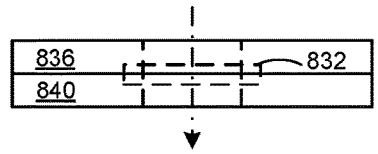
Figure 51A:
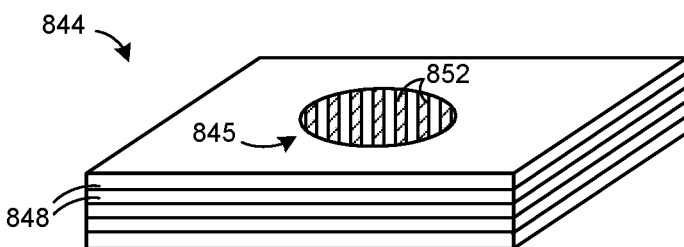
FIGS. 51(*a*)-51(*d*) are perspective and cross-sectional side views depicting embodiments of a magnetic module including magnetic structures aligned to apertures in a plurality of substrates.
Figure 51B:
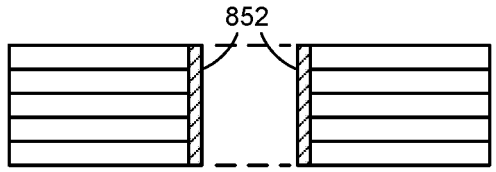
Figure 51C:
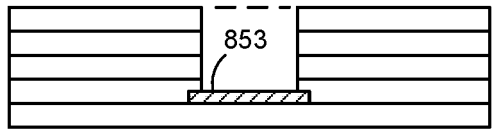
Figure 51D:
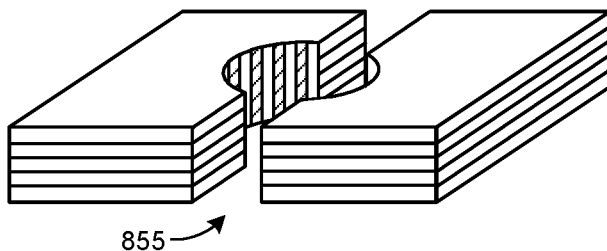

The magnetic structure may be physically aligned with apertures in a plurality of substrates. FIG. 50(*a*) depicts an exploded view of an embodiment of a magnetic device including a patterned layer 832 of a magnetic structure with an aperture aligned to apertures in a plurality of substrates 836, 840 of a substrate structure. The substrate structure may include the plurality of substrates stacked on top of each other, such as, for example, in a module. The patterned layer may be located between two substrates so that an aperture in the patterned layer aligns with apertures in each of the substrates. As discussed above in regard to FIGS. 15-16, the alignment of the apertures may create a path of travel for another component or device from one side of the magnetic device to another side of the magnetic device. FIG. 50(*b*) depicts a side view of an embodiment of the magnetic device shown in FIG. 50(*a*). The patterned layer may optionally be positioned within a recess formed in one or more of the substrates to allow for a tighter packing of the substrates into a stacked substrate structure.

The magnetic structure also may be physically aligned with one or more apertures in a module. FIG. 51(*a*)-51(*b*) depict perspective and cross-sectional side views of an embodiment of a magnetic module 844 that may include one or more magnetic structures aligned with an aperture 845 in a substrate structure having a plurality of substrates 848. The aperture may extend from one side to another side of the module through a plurality of substrates 848. The magnetic structures 852 may be connected to one or more of the substrates at the sides of the aperture so that the magnetic structures are exposed to the aperture. FIG. 51(*c*) is a cross-sectional side view depicting another embodiment of a magnetic module similar to the embodiment depicted in FIG. 51(*b*), but in which an aperture may extend from one side of the module through a plurality of substrates and end in the interior of the module, and a magnetic structure 853 may be connected to one or more of the substrates at the bottom of the aperture so that the magnetic structure is exposed to the aperture. FIG. 51(*d*) is a perspective view depicting another embodiment of a magnetic module similar to the embodiment depicted in FIGS. 51(*a*)-51(*b*), but in which an additional aperture 855 may extend from a third side of the module through a plurality of the substrates to a fourth side of the module, the additional aperture intersecting the first aperture.

Figure 52A:
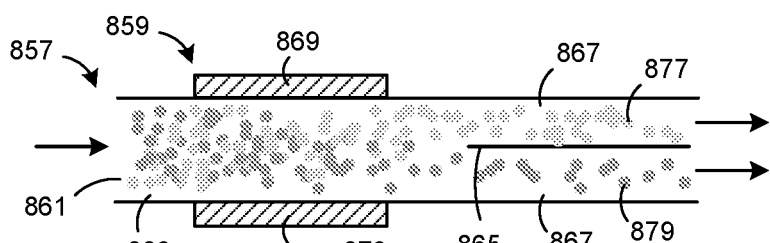
FIGS. 52(*a*)-52(*c*) are cross-sectional side views depicting embodiments of a magnetic structure formed about a fluid channel and a magnetic device including a magnetic structure formed about a fluid channel.
Figure 52B:
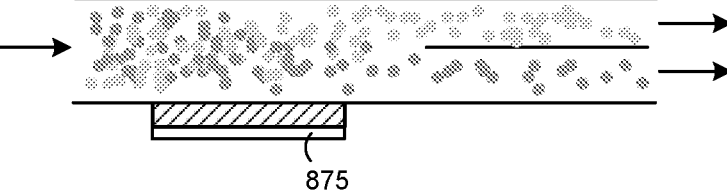
Figure 52C:
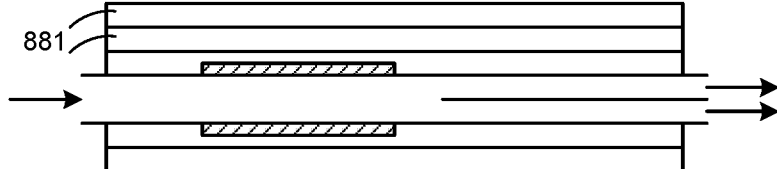

The magnetic structure also may be provided in association with a micro-fluidic structure. FIG. 52(*a*) is a cross-sectional side view depicting an embodiment of a portion of the magnetic device including a micro-fluidic channel 857 and a magnetic structure 859. The channel may include an inlet 861 to accept a flow of fluid into a first channel portion 863, a channel structure 865 to separate the channel into a plurality of second channel portions 867, and a plurality of outlets to provide fluid outflow from the second channel portions. The magnetic structure may include one or more patterned layers formed about a portion of the channel, such as a patterned layer formed connected or adjacent to a wall at least partially forming the channel. For example, as depicted in FIG. 52(*a*), the magnetic structure may include a first patterned layer formed connected to or adjacent to a first wall at least partially forming the channel, such as a layer 869 formed on top of a top wall of the channel, and a second patterned layer formed connected to or adjacent to a second wall at least partially forming the channel, such as a layer 871 formed below a bottom wall at least partially forming the channel.

The patterned layer may include a material producing a magnetic field. In embodiments, the patterned layer may include a material producing a permanent magnetic field. In FIG. 52(*a*), the patterned layer may include a hard magnetic material producing a permanent magnetic field. In other embodiments, the patterned layer may include a material producing a temporary magnetic field. In such embodiments, the magnetic device also may include a coil connected to or arranged relative to the patterned layer in a predetermined manner to set and/or change a magnetic field in the material. FIG. 52(*b*) is a cross-sectional side view depicting another embodiment of a portion of the magnetic device including a micro-fluidic channel and a magnetic structure such as shown in FIG. 52(*a*) and conductive coils 873, 875. The magnetic structure may include a patterned layer including a soft magnetic material producing a temporary magnetic field. The conductive coils may be driven by the associated circuit of the magnetic device to produce a magnetic field to set and/or supplement the magnetic field produced by the material, such as to provide one or more of a static magnetic field having a single field orientation, or a changing magnetic field having changing field orientations.

In operation, a fluid flowing into the channel at the inlet may include a plurality of different types of particles having different responses to magnetic fields, and the magnetic structure may be used to provide a magnetic field to separate the different types of particles into respective different ones of the second channel portions. For example, as depicted in FIGS. 52(*a*)-52(*b*), fluid flowing into the channel inlet may include a first type of particles 877 that may move in a first direction toward a first of the second channel portions in response to a selected applied magnetic field, and a second type of particles 879 that may move in a second direction toward a first of the second channel portions in response to a selected applied magnetic field. The different types of particles may exhibit different responses to the magnetic field as a result of their own magnetic properties. In other embodiments, the fluid or particles added to the fluid may exhibit a response to the magnetic field, producing a characteristic of the fluid flow, such as a density gradient, that may separate the different types of particles according to their density.

The magnetic device may incorporate micro-fluidic and magnetic structures such as shown in FIGS. 52(*a*)-52(*b*) in a variety of configurations. FIG. 52(*c*) depicts an embodiment of a magnetic device including the micro-fluidic and magnetic structures such as shown in FIG. 52(*a*)-52(*b*) as one or more layers in a multi-layer structure. The layers 881 of the multilayer structure may take a variety of forms. In embodiments, the layers of the multilayer structure may be layers formed on a substrate. In other embodiments, the layers of the multilayer structure may include substrates of a multi-substrate structure such as a magnetic module.

Figure 53:
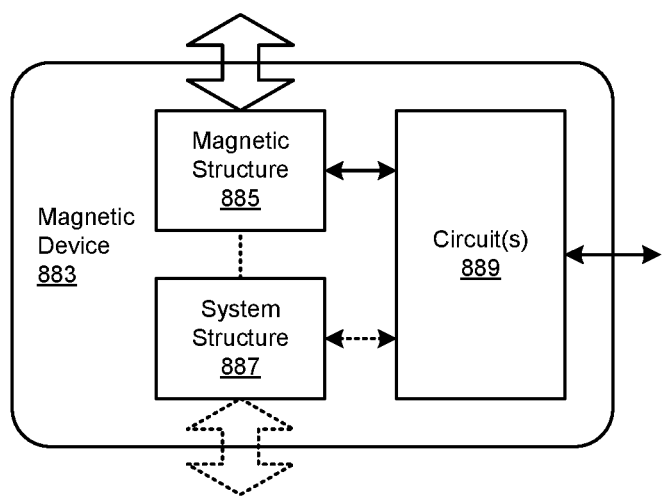
FIG. 53 is a schematic diagram depicting an embodiment of the magnetic device as or as part of a magnetic system.

The magnetic device may include a magnetic structure connected to or arranged relative to a structure of a system. FIG. 53 depicts an embodiment of the magnetic device 883 as or as part of a system having the magnetic structure connected or arranged relative to a structure of the system. The magnetic device may include a magnetic structure 885, a system structure 887, and an associated circuit 889. The system structure may include any of the structures connected to or arranged relative to the magnetic structure discussed in regard to any other embodiment of the magnetic device herein. The magnetic structure, system structure, and circuit may include any of the embodiments of these components and their interconnections and arrangements of any embodiments of the magnetic device discussed herein.

Figure 54A:
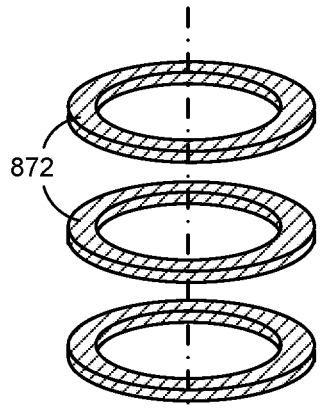
FIGS. 54(*a*)-54(*b*) are exploded perspective and perspective views depicting embodiments of magnetic structures.
Figure 54B:
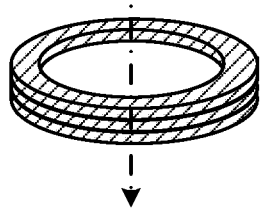

The magnetic device also may include a magnetic structure including a plurality of aligned patterned layers. FIG. 54(*a*) depicts an exploded view of an embodiment of magnetic structure including a plurality of patterned layers 872 arranged in a stack. Each of the patterned layers may include an aperture aligned with apertures of the other magnetic structures in the stack. Each of the patterned layers also may optionally include a boundary or shape aligned to that of the other magnetic structures in the stack. The patterned layers may each be separately formed patterned layers such as discussed above in regard to FIGS. 10(*a*)-10(*b*). FIG. 54(*b*) depicts a non-exploded perspective view of the magnetic structure depicted in FIG. 54(*a*).

Figure 55A:
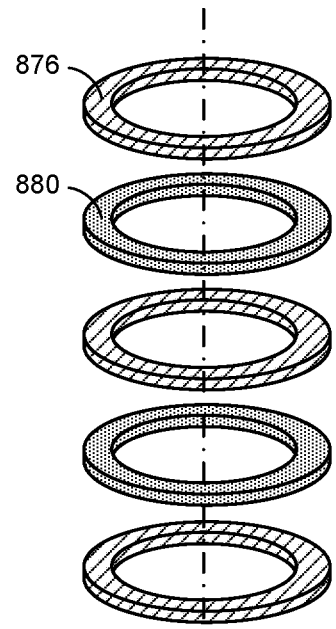
FIGS. 55(*a*)-55(*b*) are exploded perspective and perspective views depicting embodiments of magnetic structures.
Figure 55B:
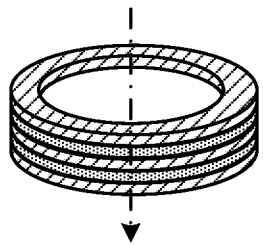

The magnetic structure also may include a plurality of aligned patterned layers arranged in combination with other layers. FIG. 55(*a*) depicts an exploded view of an embodiment of magnetic structure including a plurality of patterned layers 876 arranged in combination with other layers 880 in a stack. Each of the patterned layers and the other layers may include an aperture aligned with apertures of the other layers in the stack. Each of the patterned layers also may optionally include a boundary or shape aligned to that of the other magnetic structures in the stack. The patterned layers may each be separately formed patterned layers, such as with or without a corresponding substrate, as discussed above. The other layers may include a non-magnetic material such as a substrate on which the patterned layers may be formed or a separate spacer. FIG. 55(*b*) depicts a non-exploded perspective view of the magnetic structure depicted in FIG. 55(*a*).

As discussed above, the magnetic device may include circuitry that may be electrically connected to one or more of the magnetic structure and other device structures to provide functions such as providing, receiving, conditioning, and processing of signals of the magnetic structure and other device structures.

The magnetic device may incorporate the circuit on a same substrate as the magnetic structure. For example, the magnetic device may incorporate the circuit and the magnetic structure on a same side of a substrate, each in a separate area or in the same area. Alternatively, the magnetic device may incorporate the circuit on a different side of a substrate from the magnetic structure. The magnetic device also may incorporate the circuit on a different substrate than that including the magnetic structure.

The magnetic device may include a circuit to perform one or more of receiving and manipulating an electrical signal from the magnetic structure of the magnetic device, generating and providing an electrical signal to the magnetic structure, generating and providing an electrical signal to a conductive coil, or generating and providing an electrical signal to a transmitter, among other functions.

Figure 56:
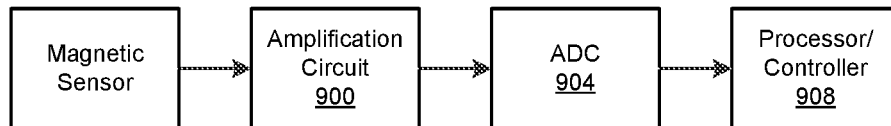
FIG. 56 is a circuit schematic depicting an embodiment of a magnetic structure and a circuit to receive and process signals from the magnetic structure.

For example, the magnetic device may include a circuit to receive and manipulate electrical signals from the magnetic structure. FIG. 56 depicts an embodiment of the magnetic structure and a circuit that may be used to receive and manipulate electrical signals from the magnetic structure. The circuit may include an amplification circuit 900, an analog-to-digital converter (ADC) 904, and a processor or controller 908. The amplification circuit 900 may be electrically coupled to the magnetic structure to receive an output of the magnetic structure and perform one or more of buffering or amplifying the signal received from the magnetic structure. The amplification circuit 900 may include one or more operational amplifiers to perform the buffering or amplifying. The ADC 904 may be electrically coupled to the amplification circuit to receive an output of the amplification circuit 900 and convert the received signal from an analog to a digital representation. The ADC 904 may include one or more of a flash ADC, pipeline ADC, sigma-delta ADC, successive approximation ADC, etc. The processor or controller 908 may be electrically coupled to the ADC 904 to receive an output of the ADC 904 and perform one or more of processing the received digitized signal to extract information from the digitized signal or generate a control signal as a function of the digitized signal.

Figure 57:
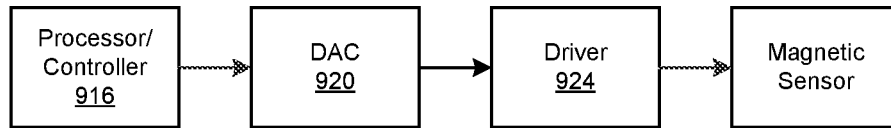
FIG. 57 is a circuit schematic depicting an embodiment of a magnetic structure and a circuit to generate and provide electrical signals to the magnetic structure.

The magnetic device also may include a circuit to generate and provide an electrical signal to the magnetic structure. FIG. 57 depicts an embodiment of the magnetic structure and a circuit that may be used to generate and provide an electrical signal to the magnetic structure. The circuit may include a processor or controller 916, a digital-to-analog converter (DAC) 920, and a driver circuit 924. The processor or controller 916 may generate a control signal representing an electrical signal to be provided to the magnetic structure. The processor or controller 916 may generate the control signal by as a function of a digitized signal representing a signal output by the magnetic structure or another signal. The DAC 920 may be electrically coupled to the processor or controller to receive the control signal output by the processor or controller 916 and convert the control signal from a digital to an analog representation. The DAC 920 may include one or more of a R-2R ladder DAC, an oversampling DAC, a hybrid DAC, etc. The driver circuit 924 may be electrically coupled to the DAC 920 to receive the analog signal output from the DAC 920 and provide a corresponding drive signal to the magnetic structure. The driver circuit 924 may perform one or more of buffering or amplifying the signal from the DAC 920. The driver circuit 924 may include one or more transistors to perform the buffering or amplifying.

The magnetic device also may include a circuit to generate and provide an electrical signal to a conductive coil. The conductive coil may be used to generate a magnetic field to set or alter properties of, or to be otherwise used in association with, the magnetic structure. FIG. 58 depicts an embodiment of a circuit that may be used to generate and provide an electrical signal to the conductive coil. The circuit may include a processor or controller 932, a digital-to-analog converter (DAC) 936, and a driver circuit 940. The processor or controller 932 may generate a control signal representing an electrical signal to be provided to the conductive coil. The processor or controller 932 may generate the control signal by as a function of a digitized signal representing a signal output by the magnetic structure or another signal. The DAC 936 may be electrically coupled to the processor or controller to receive the control signal output by the processor or controller 932 and convert the control signal from a digital to an analog representation. The DAC 936 may include one or more of a R-2R ladder DAC, an oversampling DAC, a hybrid DAC, etc. The driver circuit 940 may be electrically coupled to the DAC 936 to receive the analog signal output by the DAC 936 and provide a corresponding drive signal to the conductive coil. The driver circuit 940 may perform one or more of buffering or amplifying the signal from the DAC 936. The driver circuit 940 may include one or more transistors to perform the buffering or amplifying.

The magnetic device also may include a circuit to generate and provide an electrical signal based on a signal from the magnetic structure, such as representing a magnetic field or current sensed by the magnetic structure, for transmission. FIG. 59 depicts an embodiment of a magnetic sensor and a circuit that may be used to generate and provide an electrical signal to a transmitting element. The circuit may include an amplification circuit 945, and ADC 947, a transmitter 949 and a transmitting element 951 such as a conductive coil, antenna, etc. The amplification circuit and ADC may be configured and operate as discussed above in regard to the circuit of FIG. 49. The transmitter circuit may be electrically coupled to the ADC to receive the digital signal output by the ADC and provide a corresponding transmission drive signal to the transmitting element.

In embodiments where the magnetic structure forms a magnetic sensor, such as, e.g., an anisotropic magnetoresistive sensor or other magnetoresistive sensor, several embodiments of the amplification and driver circuits may be provided. FIG. 60 depicts an embodiment of a magnetic sensor 960 and an amplification circuit 964 to provide an output representing a sensed magnetic field. The amplification circuit may include a single operational amplifier, and the magnetic sensor may include a single magnetoresistor 968. FIG. 61 depicts an embodiment of a magnetic sensor 968 and an amplification circuit and linearizing circuit 972 to provide a linearized output representing a sensed magnetic field. The amplification and linearizing circuit may including a single operational amplifier, and the magnetic sensor may include a single magnetoresistor. FIG. 62 depicts another embodiment of a magnetic sensor 976, an amplification circuit 980, and a linearizing circuit 984 to provide a linearized output representing a sensed magnetic field. The amplification and linearizing circuits may each include an operational amplifier, and the magnetic sensor may include a single magnetoresistor. FIG. 63 depicts an embodiment of a magnetic sensor 988 and an amplification circuit and linearizing circuit 992 to provide an output representing a sensed magnetic field. The amplification and linearizing circuit may include a single operational amplifier, and the magnetic sensor may include a pair of magnetoresistors. FIG. 64 depicts an embodiment of a magnetic sensor 996, an amplification circuit 1000, and linearizing circuit 1004 to provide a linearized output representing a sensed magnetic field. The amplification and linearizing circuits may each include an operational amplifier, and the magnetic sensor may include a pair of magnetoresistors. In other embodiments, the amplification circuit to provide an output representing a sensed magnetic field may include one or more operational transconductance amplifiers.

The magnetic sensor also may be driven to bias, drive, or modulate signals of the sensor. FIG. 65 depicts an embodiment of a magnetic sensor 1008 and a driver circuit 1012 that may be used to bias, drive or modulate signals of the magnetic sensor. The magnetic sensor and driver circuit of FIG. 65 also may be used with embodiments of an amplification circuit, such as any of the embodiments of the amplification and/or linearizing circuits in FIGS. 60-64.

Embodiments of the circuit of the magnetic device may include any subset or combination of components of any of the circuits discussed herein. For example, the circuit may include one or more components of any of the circuits discussed herein. The circuit also may include one or more components of one or more of the circuits discussed herein arranged in any order, such as an order different from that shown in the exemplary figures. The circuit also may include components in addition to the components or any subset of components of the circuits discussed herein.

Signals of and between the circuits and subcircuits discussed above may be either single-ended or differential signals.

The patterned layers discussed herein may be formed as a thin films, such as layers produced by integrated circuit substrate processing. Alternatively, the patterned layers discussed herein may be relatively thick films, such as layers produced by screen printing or other thick film processes.

Any feature of any of the embodiments of the magnetic device described herein can optionally be used in any other embodiment of the magnetic device. For example, embodiments of the magnetic device may include any combination of any embodiment of the magnetic structure discussed herein with any embodiment of the other device structure discussed herein and any embodiment of the circuit discussed herein. Also, embodiments of the magnetic device can optionally include any subset of the components or features of the magnetic device discussed herein. For example, embodiments of the magnetic device may optionally include any combination of any embodiment of the magnetic structure discussed herein with any embodiment of the other device structure discussed herein, while omitting the circuit.

What is claimed is:

1. A magnetic device comprising:
   a micro-fluidic channel embedded in a multi-layer structure, the micro-fluidic channel comprising an inlet arranged to receive a fluid that includes different types of particles; and
   a magnetic structure embedded in the multi-layer structure, the magnetic structure positioned about the micro-fluidic channel, and the magnetic structure arranged to produce a magnetic field to cause the different types of particles in the fluid to be separated in the micro-fluidic channel.

2. The magnetic device of claim 1, wherein the magnetic structure includes patterned layers on opposing sides of the micro-fluidic channel, the patterned layers comprising material configured to produce the magnetic field.

3. The magnetic device of claim 2, further comprising conductive coils electrically connected to the patterned layers.

4. The magnetic device of claim 1, wherein the multi-layer structure comprises a plurality of layers on a substrate.

5. The magnetic device of claim 1, wherein the multi-layer structure comprises a plurality of substrates.

6. The magnetic device of claim 1, wherein the micro-fluidic channel is configured to receive the fluid in a first channel portion, wherein the micro-fluidic channel comprises a channel structure that separates the micro-fluidic channel into a plurality of second channel portions, and wherein the second channel portions are arranged to receive respective one of the different types of particles.

7. The magnetic device of claim 1, wherein the magnetic structure comprises a hard magnetic material.

8. The magnetic device of claim 1, wherein the magnetic structure comprises a soft magnetic material.

9. The magnetic device of claim 1, wherein the inlet is the only inlet of the micro-fluidic channel.

10. The magnetic device of claim 1, further comprising an aperture, wherein the magnetic structure is physically aligned with the aperture.

11. The magnetic device of claim 1, further comprising a second magnetic structure, wherein the multi-layer structure comprises a cap, and wherein the second magnetic structure is on the cap.

12. A method of separating particles, the method comprising:
   receiving a fluid via an inlet of a micro-fluidic channel embedded in a multi-layer structure, wherein the fluid comprises different types of particles;
   applying, with a magnetic structure positioned about the micro-fluidic channel and embedded in the multi-layer structure, a magnetic field to the fluid in the micro-fluidic channel; and
   in response to applying the magnetic field, separating the different types of particles in the fluid into respective different channel portions of the micro-fluidic channel.

13. The method of claim 12, further comprising driving a conductive coil electrically connected to the magnetic structure to impact the magnetic field.

14. The method of claim 12, wherein the magnetic structure comprises two patterned layers on opposing sides of the micro-fluidic channel.

15. A magnetic device comprising:
   a micro-fluidic channel comprising an inlet arranged to receive a fluid that includes different types of particles;
   a magnetic structure comprising a patterned layer positioned about the micro-fluidic channel, the patterned layer comprising material configured to produce a magnetic field to cause the different types of particles in the fluid to be separated in the micro-fluidic channel, wherein the micro-fluidic channel and the magnetic structure are embedded in a multi-layer structure; and
   a conductive coil electrically connected to the patterned layer.

16. The magnetic device of claim 15, wherein the multi-layer structure comprises a plurality of layers on a substrate.

17. The magnetic device of claim 15, further comprising a second conductive coil, wherein the magnetic structure comprises a second patterned layer electrically connected to the second conductive coil, and wherein the patterned layer and the second patterned layer are positioned on opposing sides of the micro-fluidic channel.

18. The magnetic device of claim 15, further comprising a circuit configured to drive the conductive coil to impact the magnetic field.

19. The magnetic device of claim 15, further comprising an aperture, wherein the magnetic structure is physically aligned with the aperture.

20. The magnetic device of claim 15, further comprising a cap and a second magnetic structure on the cap.

* * * * *